US008525552B2

(12) United States Patent
Ando et al.

(10) Patent No.: US 8,525,552 B2
(45) Date of Patent: Sep. 3, 2013

(54) SEMICONDUCTOR INTEGRATED CIRCUIT DEVICE HAVING A PLURALITY OF STANDARD CELLS FOR LEAKAGE CURRENT SUPPRESSION

(75) Inventors: Takashi Ando, Shiga (JP); Keiichi Kusumoto, Hyogo (JP); Kenji Shimazaki, Osaka (JP); Kazuyuki Nakanishi, Osaka (JP); Tetsurou Toubou, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/562,144

(22) Filed: Jul. 30, 2012

(65) Prior Publication Data
US 2013/0027083 A1 Jan. 31, 2013

(30) Foreign Application Priority Data

Jul. 28, 2011 (JP) ................................. 2011-165306

(51) Int. Cl.
*H01L 25/00* (2006.01)
*H01L 21/82* (2006.01)
*H03K 19/00* (2006.01)
*H03K 19/094* (2006.01)

(52) U.S. Cl.
USPC ............. 326/103; 326/102; 326/50; 327/564; 438/128

(58) Field of Classification Search
USPC ........... 326/101–103, 50; 327/564; 438/128, 438/598
See application file for complete search history.

(56) References Cited

U.S. PATENT DOCUMENTS

| 7,055,121 | B1 | 5/2006 | Bolander et al. |
| 7,492,013 | B2 * | 2/2009 | Correale, Jr. .................. 257/368 |
| 7,503,026 | B2 * | 3/2009 | Ichiryu et al. ................. 716/130 |
| 7,750,681 | B2 * | 7/2010 | Ogata ........................... 326/101 |
| 8,020,121 | B2 * | 9/2011 | Kobayashi ...................... 716/55 |
| 2005/0044522 | A1 * | 2/2005 | Maeda ............................ 716/18 |
| 2008/0040698 | A1 | 2/2008 | Ferrari et al. |
| 2008/0169487 | A1 * | 7/2008 | Shimbo et al. ................ 257/207 |
| 2009/0079465 | A1 * | 3/2009 | Sasaki et al. .................... 326/21 |
| 2009/0184758 | A1 * | 7/2009 | Motomura .................... 327/544 |
| 2010/0270600 | A1 | 10/2010 | Inukai et al. |
| 2011/0049575 | A1 * | 3/2011 | Tanaka ........................... 257/206 |
| 2011/0298010 | A1 | 12/2011 | Menut et al. |

FOREIGN PATENT DOCUMENTS

| JP | 2005-236210 A | 9/2005 |
| JP | 2011-129550 A | 6/2011 |

* cited by examiner

*Primary Examiner* — Shawki Ismail
*Assistant Examiner* — Dylan White
(74) *Attorney, Agent, or Firm* — McDermott Will & Emery LLP

(57) ABSTRACT

A semiconductor integrated circuit device includes cells A-1, B-1, and C-1 that have the same logic. Cell B-1 has cell width W2 larger than a cell width of cell A-1, but gate length L1 of a MOS transistor is equal to that of cell A-1. Cell C-1 has cell width W2 equal to a cell width of cell B-1, but has a MOS transistor having large gate length L2. A circuit delay of cell C-1 becomes large as compared with that of cells A-1 and B-1, but leak current becomes small. Therefore, by replacing cell A-1 adjacent to a space area with cell B-1, and by replacing cell B-1 in a path having room in timing with cell C-1, for example, leak current can be suppressed without increasing a chip area.

16 Claims, 22 Drawing Sheets

FIG. 1A
Cell A-1
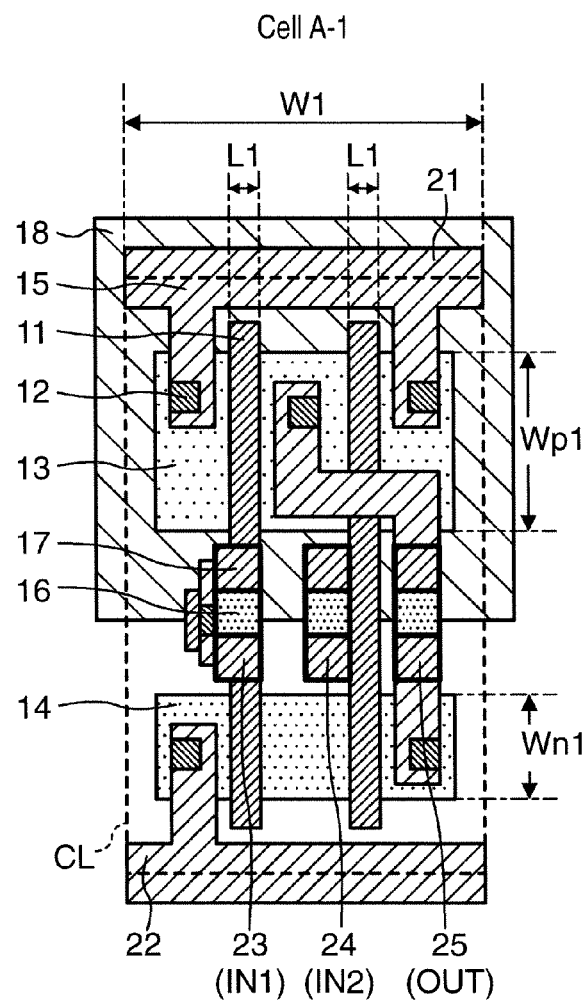
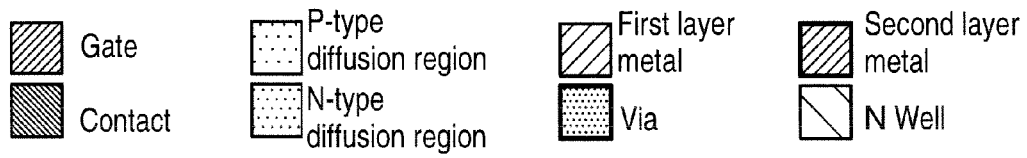

FIG. 1B
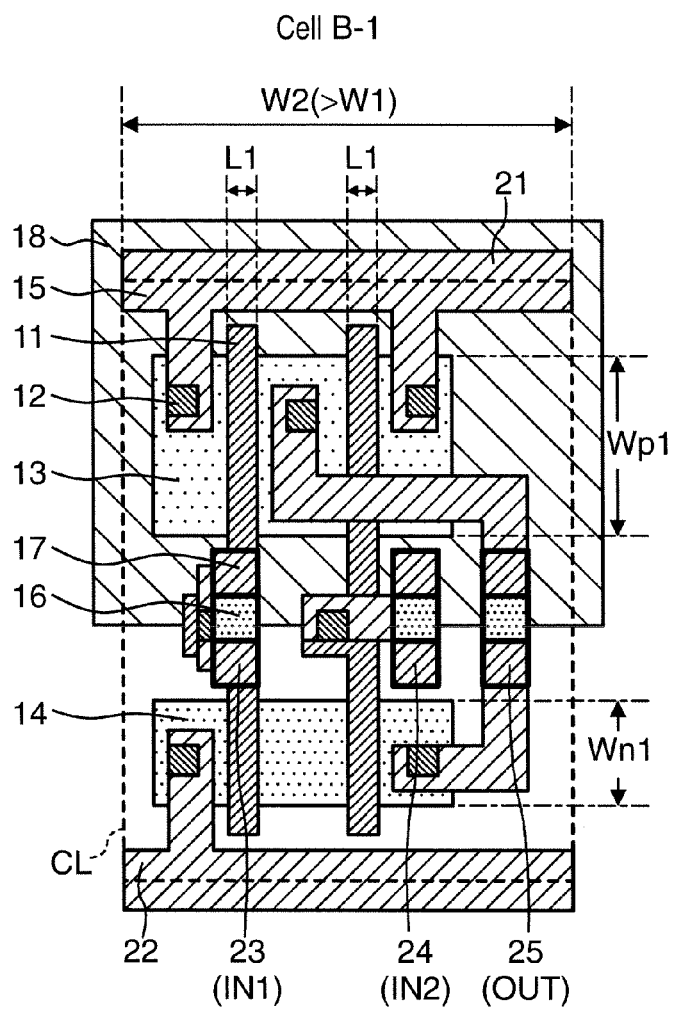
Cell B-1
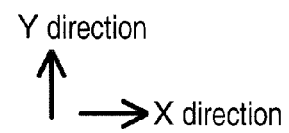

FIG. 1C
Cell C-1
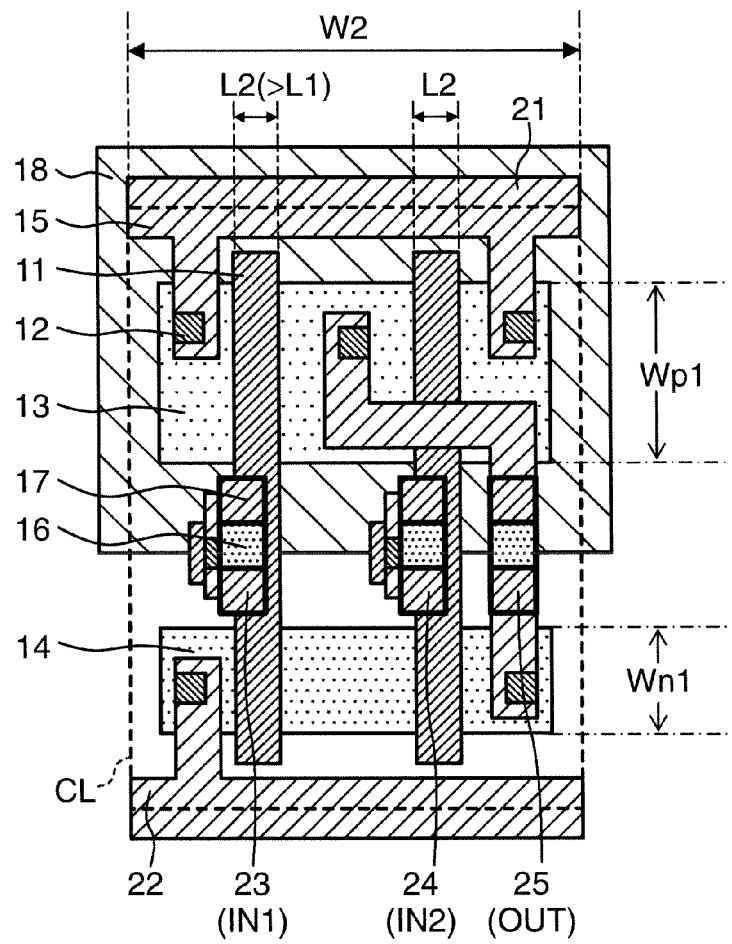
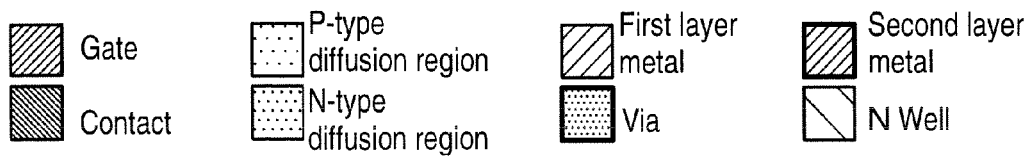
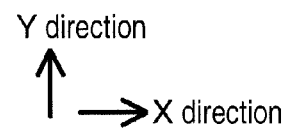

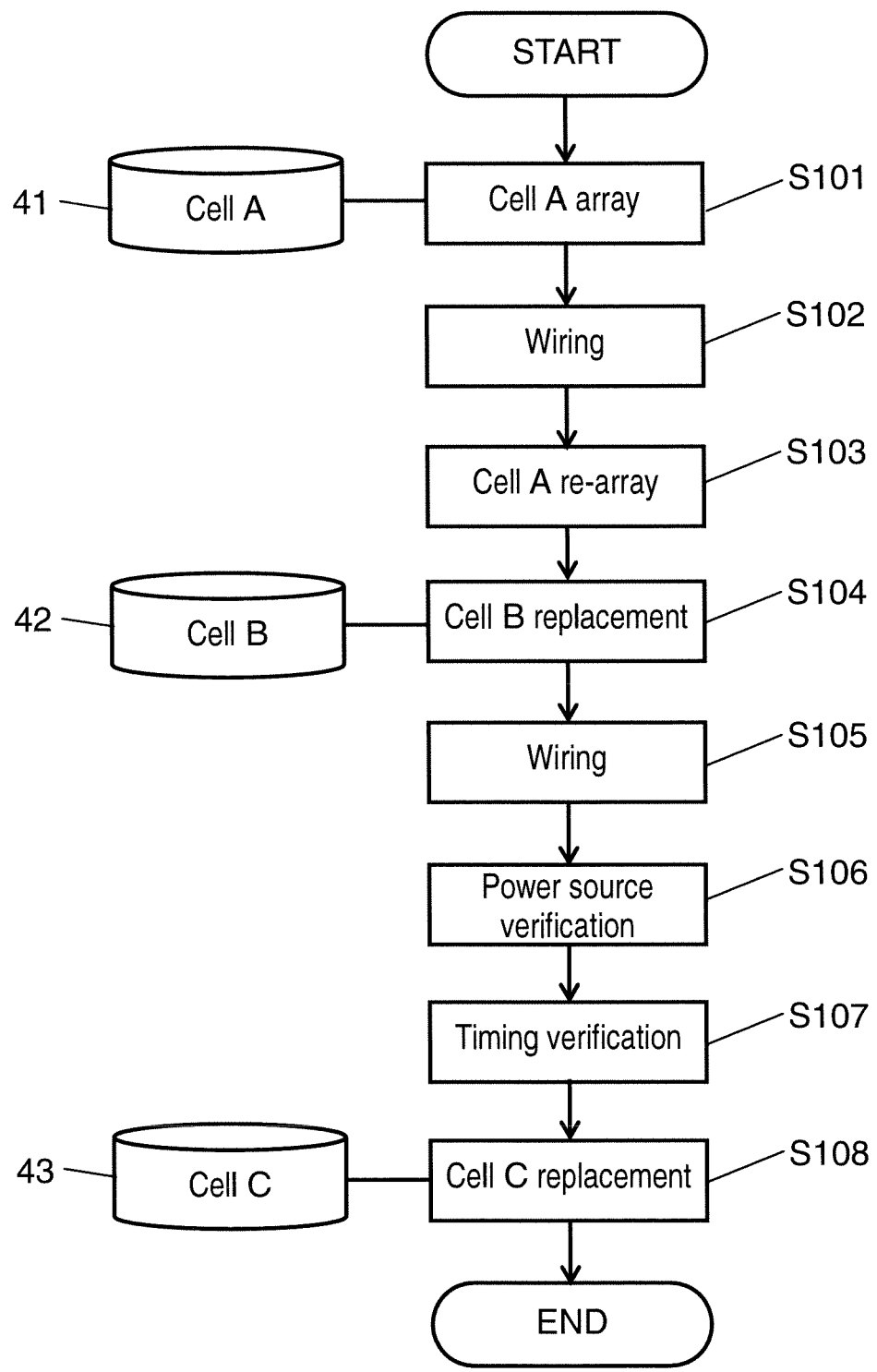

FIG. 4
Cell C-2
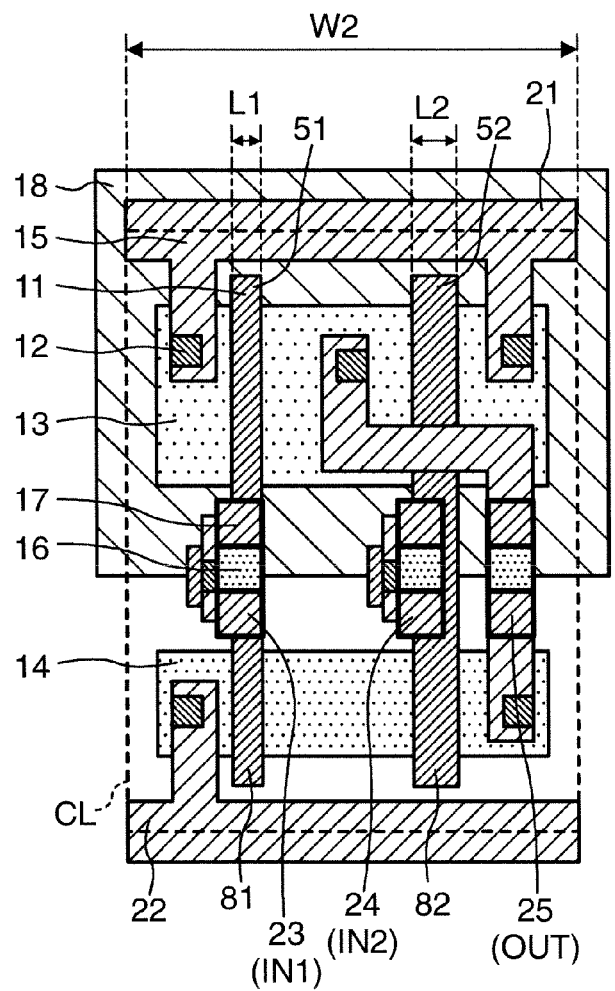
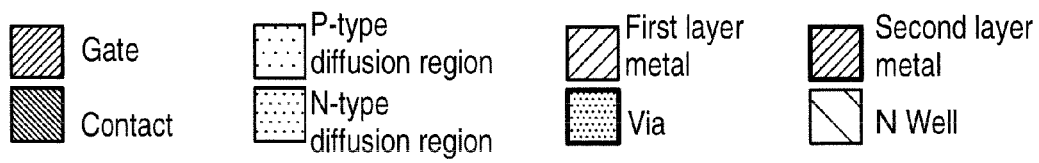

FIG. 6A
Cell B-2
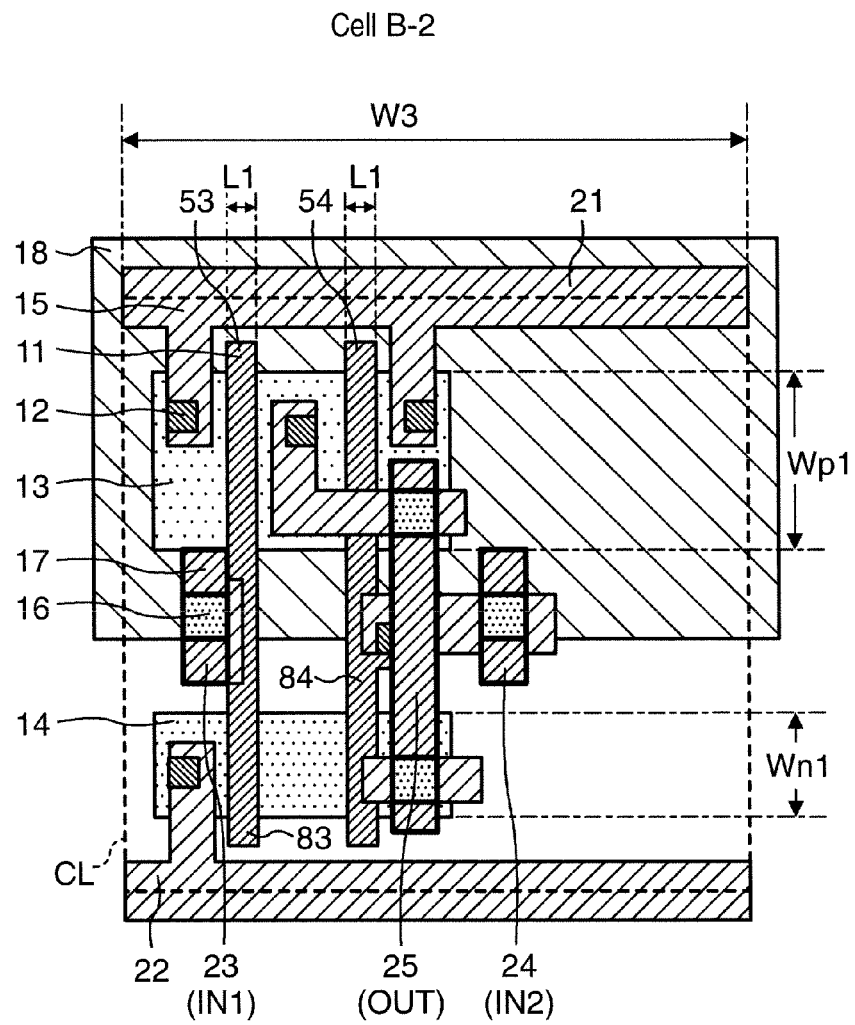
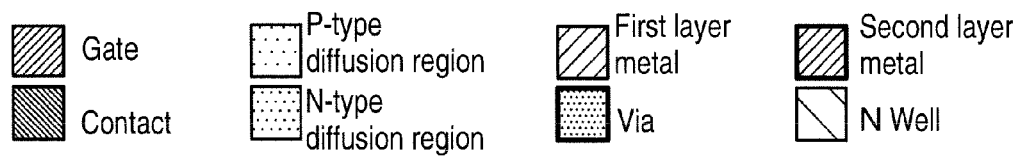

FIG. 6B
Cell C-3
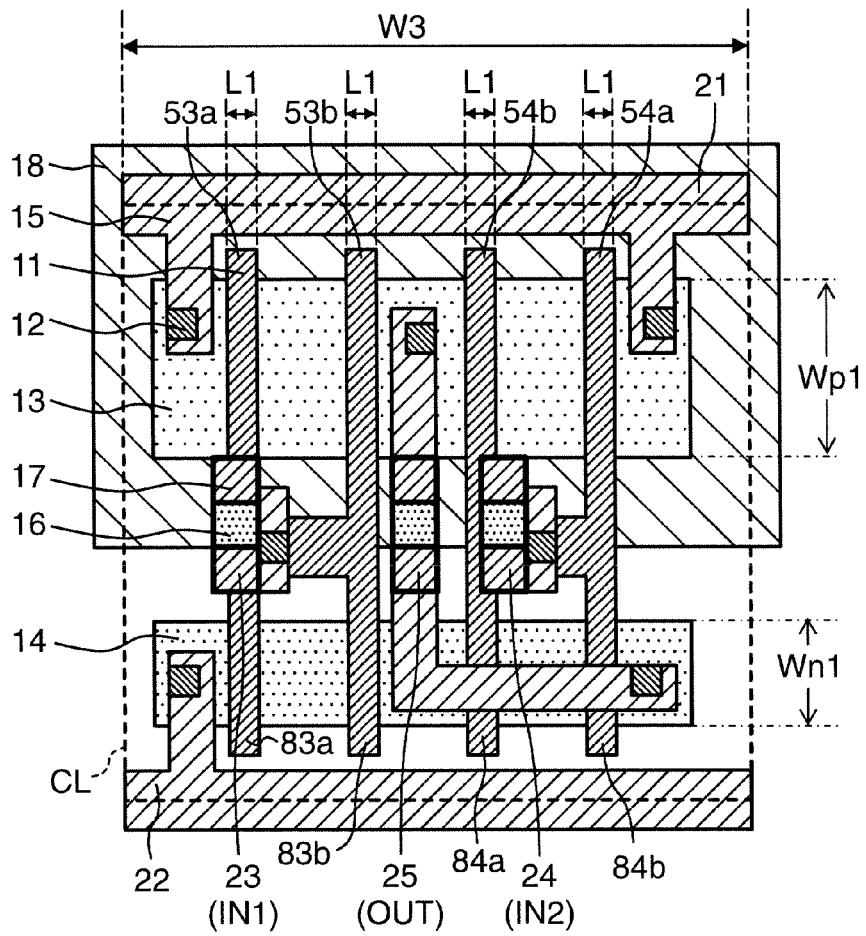
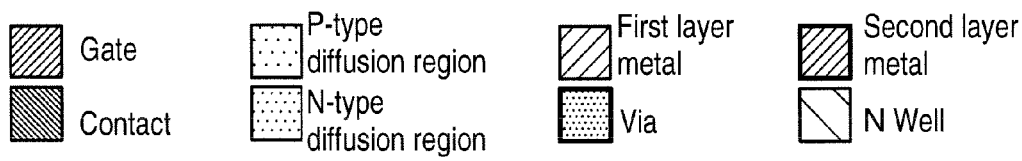

Cell C-3

FIG. 8A
Cell A-2
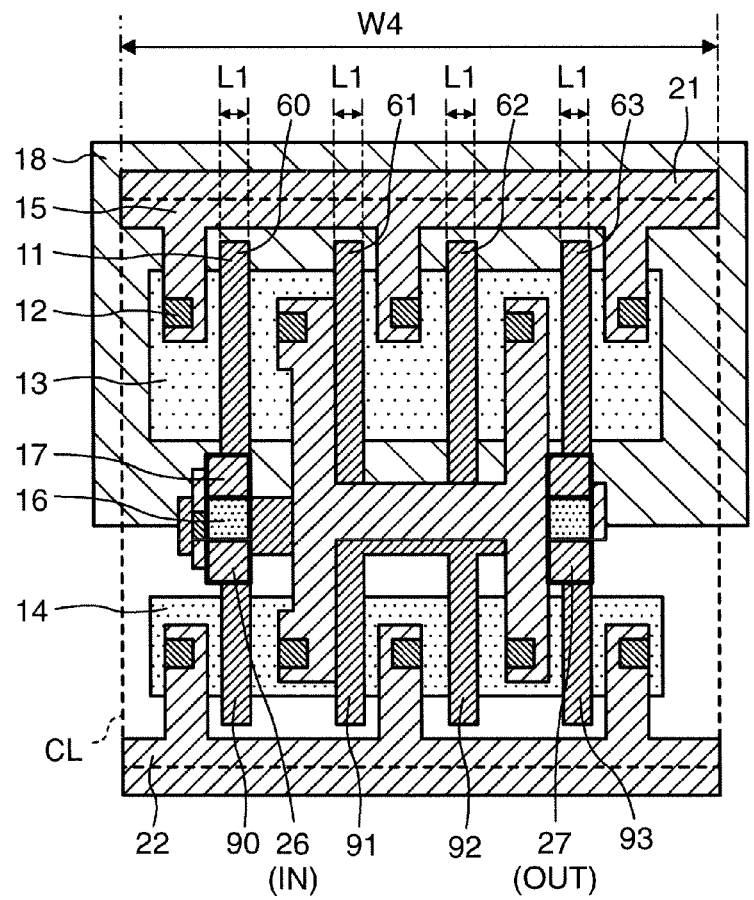
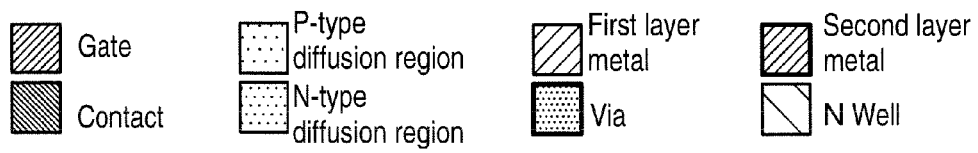

FIG. 8B
Cell D-1
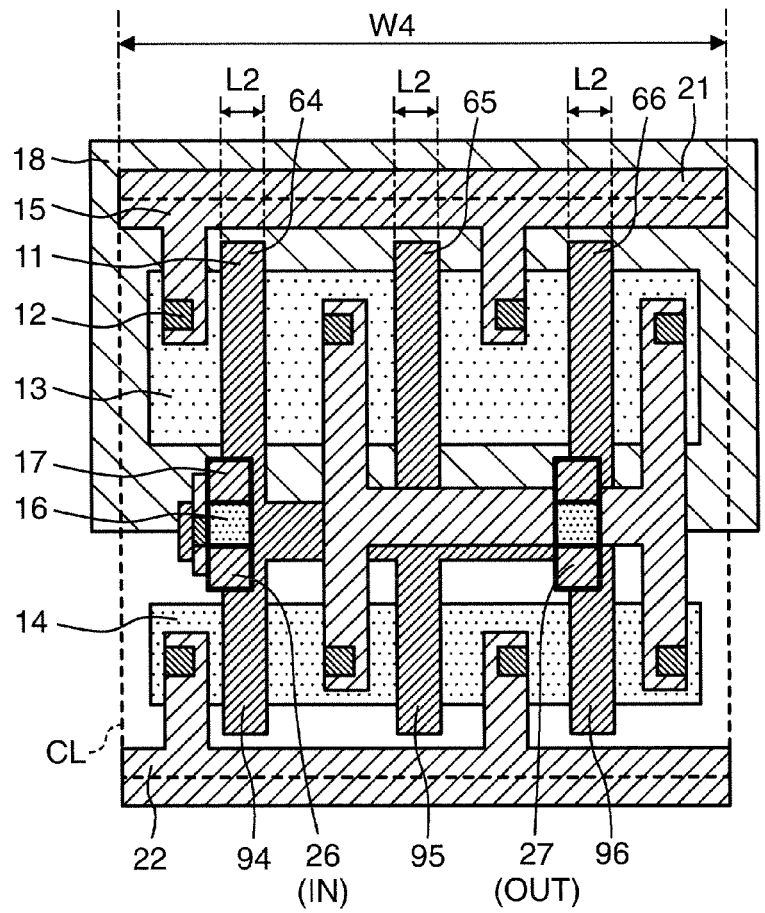
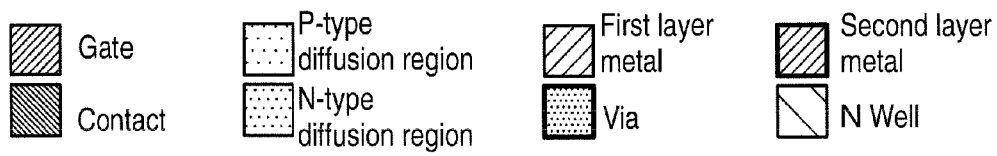

Cell A-2

Cell D-1

FIG. 12
Cell D-2
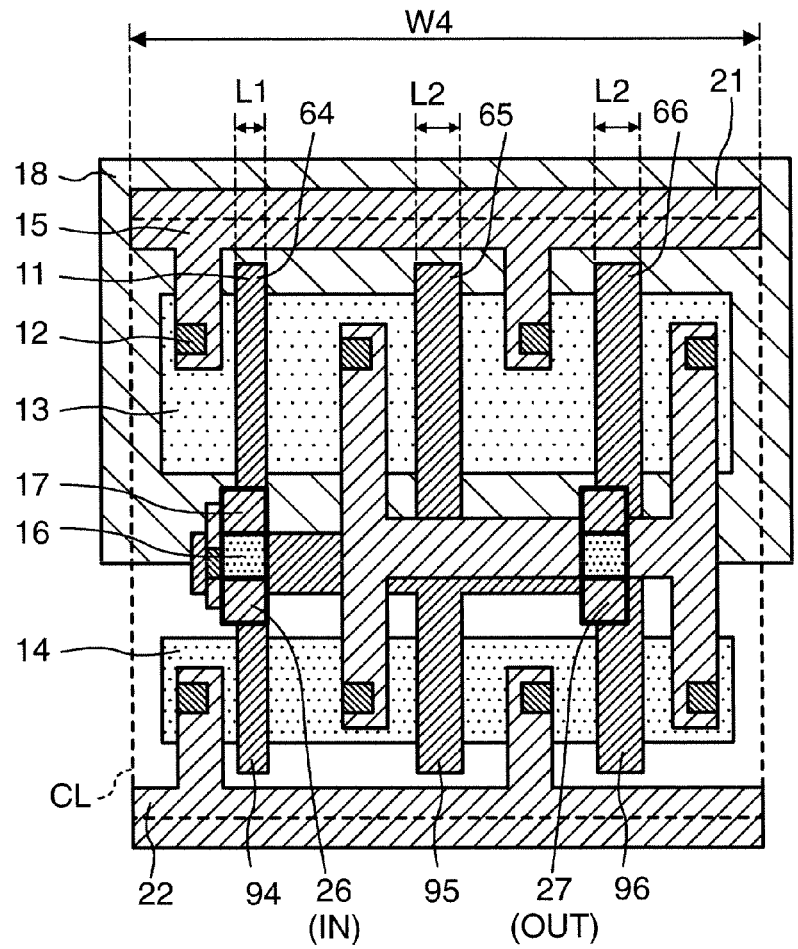
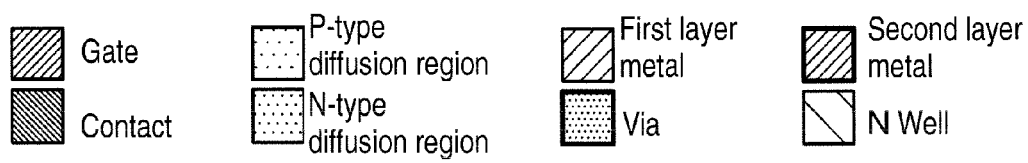

FIG. 13
Cell D-3
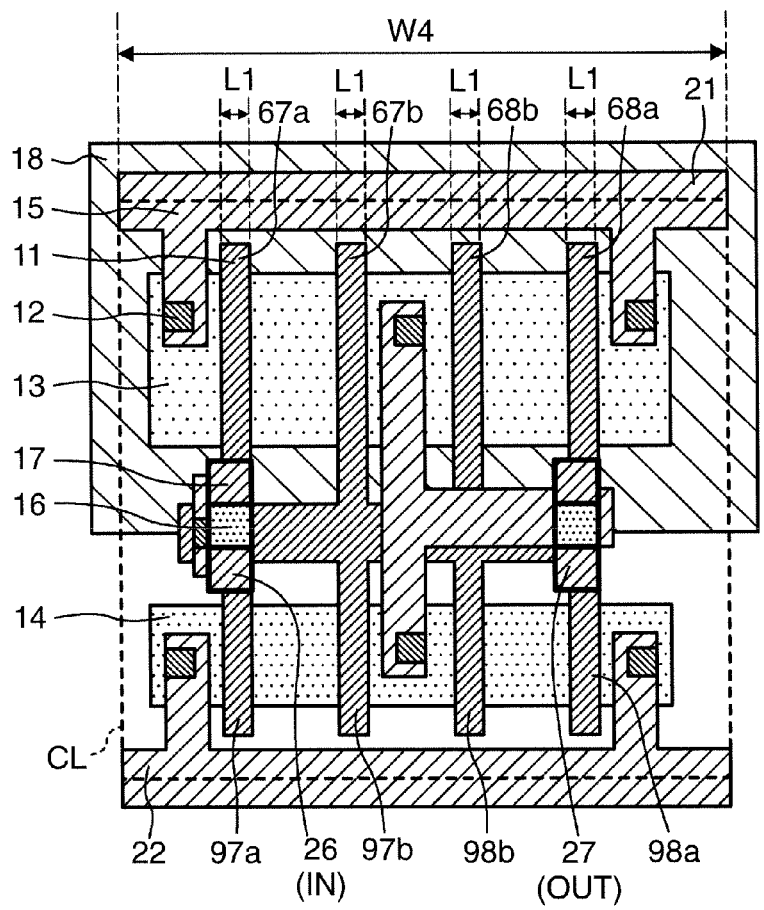
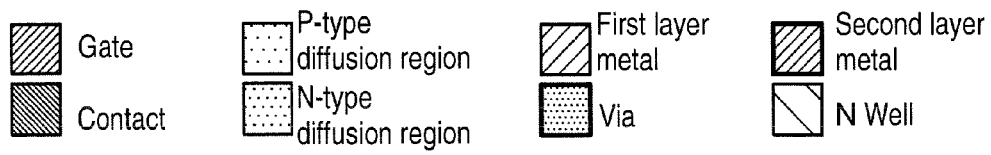
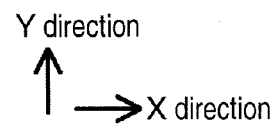

Cell D-3

SEMICONDUCTOR INTEGRATED CIRCUIT DEVICE HAVING A PLURALITY OF STANDARD CELLS FOR LEAKAGE CURRENT SUPPRESSION

BACKGROUND

1. Field of the Invention

The present invention relates to a semiconductor integrated circuit device, and particularly relates to a semiconductor integrated circuit device that is formed by a layout design using a standard cell system.

2. Description of the Related Art

In a layout design of a semiconductor integrated circuit device using a standard cell system, a layout generation tool called a place and route tool (P and R tool) is used. The automatic layout wiring tool is for obtaining a desired semiconductor integrated circuit device, by registering in advance standard cells into a standard cell library as a database, reading data of the standard cells of a desired basic circuit from the database, and arraying and wiring the data in a predetermined region. In the standard cells, there are cells such as an inverter, a NAND, and an NOR that achieve mutually different logics and functions. For a majority of the standard cells that are included in the standard cell library, layout of the standard cells is generated, by prioritizing a minimum rule that is prescribed by a design rule.

In recent years, miniaturization of a manufacturing process in a semiconductor integrated circuit device is progressed, and a gate length of a gate tends to become increasingly shorter. The gate length is a distance between a drain and a source of a MOS transistor. In the semiconductor integrated circuit device that uses the standard cell system, it is becoming difficult to simultaneously achieve both suppression of leak current of a device and increase of on-current, due to development of the miniaturization process. That is, although on-current can be increased by shortening a gate length, leak current also increases. Therefore, in a high-performance chip of large on-current, leak current increases, and this becomes a cause of an increase in power consumption.

To suppress leak current, there is a method of forming a semiconductor integrated circuit device corresponding to performance, by preparing a standard cell that uses a device of high performance and much leak current, and a standard cell that uses a device of low performance and little leak current, and by selectively combining these standard cells in processes of synthesis and P and R tool.

As a method of separately manufacturing a device of high performance and much leak current and a device of little leak current, there is a method of separately manufacturing devices of plural threshold voltages Vt, by including plural sets of injection masks, and by controlling the threshold voltage Vt of the devices, and a method of separately manufacturing devices of plural gate lengths by adjusting layout of a gate length. The method of controlling a gate length is advantageous in cost and a cycle time as compared with the method of controlling the threshold voltage Vt, because there is no increase in injection masks and injection processes.

Patent Document 1 discloses a layout configuration of standard cells that makes it possible to control a gate length to suppress leak current. The standard cells include gates of MOS transistors, and regions for extending a gate length between adjacent contacts. Layout is improved to be able to suppress leak current without changing existing processes.

FIGS. 15A and 15B show examples of layout of standard cells disclosed in Patent Document 1. The layout of standard cells shown in FIG. 15A includes a region for arraying an extension poly between gate poly 101 and adjacent contacts 102. That is, a distance Space-2 between gate poly 101 and contacts 102 is set greater than a minimum distance that is prescribed by the design rule. With this arrangement, the extension poly can be arrayed without changing layout other than that of gate poly 101. A gate length can be extended by only revising a gate poly, and a short-channel effect can be suppressed. FIG. 15B shows a layout example in which extension poly 103 is arrayed (see FIG. 2 in Patent Document 1: Unexamined Japanese Patent Publication No. 2005-236210).

SUMMARY OF THE INVENTION

The standard cells disclosed in Patent Document 1 are advantageous in that leak current can be suppressed without changing the layout other than that of the gate. However, to effectively suppress the leak current, a gate length needs to be set large by about a few dozens of percentages. Therefore, when a technique of Patent Document 1 is simply used, an interval between the gate and adjacent contacts needs to be set substantially larger than a minimum interval in advance, to sufficiently secure a region in which a gate length can be extended, in each standard cell. Consequently, a size of each standard cell is designed to be large. When a standard cell like this is used, there occurs a problem that a chip area becomes large as a result.

An object of the present invention is therefore to provide a semiconductor integrated circuit device that can efficiently suppress leak current without increasing a chip area.

According to one aspect of the present invention, a semiconductor integrated circuit device arrayed with plural standard cells includes a first standard cell which has a first cell width and in which a MOS transistor constituting a circuit has a first gate length; a second standard cell which has the same logic as that of the first standard cell and has a second cell width larger than the first cell width, and in which a MOS transistor constituting a circuit has the first gate length; and a third standard cell which has the same logic as that of the first and second standard cells and has the second cell width, and in which a shape of a gate of a MOS transistor constituting a circuit is different from that of the second standard cell. The third standard cell includes at least one MOS transistor having a second gate length larger than the first gate length.

According to this aspect, the semiconductor integrated circuit device includes the first, second, and third standard cells that have the same logic. The second standard cell has a cell width larger than that of the first standard cell, but a gate length of a MOS transistor constituting a circuit is equal to that of the first standard cell. The third standard cell has a cell width equal to that of the second standard cell, but a shape of a gate of a MOS transistor constituting a circuit is different from that of the second standard cell. That is, the third standard cell has a MOS transistor having a gate length longer than that of the first and second standard cells. Accordingly, leak current becomes small although a circuit delay becomes large, as compared with first and second standard cells. Therefore, by replacing the first standard cell adjacent to a space area with the second standard cell, and by replacing the second standard cell in a path having room in timing with the third standard cell, for example, leak current can be suppressed without increasing a chip area.

According to one aspect of the present invention, a semiconductor integrated circuit device arrayed with plural standard cells includes a first standard cell which has a first cell width and in which a MOS transistor constituting a circuit has a first gate length; a second standard cell which has the same logic as that of the first standard cell and has a second cell width larger than the first cell width, and in which a MOS transistor constituting a circuit has the first gate length; and a third standard cell which has the same logic as that of the first and second standard cells and also has the second cell width, and in which a shape of a gate of a MOS transistor constituting a circuit is different from that of the second standard cell. The third standard cell includes two or more MOS transistors which correspond to one MOS transistor that the second standard cell has, which have the first gate lengths, which are connected in series, and have the gates connected in common.

According to this aspect, the semiconductor integrated circuit device includes the first, second, and third standard cells that have the same logic. The second standard cell has a cell width larger than that of the first standard cell, but a gate length of a MOS transistor constituting a circuit is equal to that of the first standard cell. The third standard cell has a cell width equal to that of the second standard cell, but a layout shape of a gate of a MOS transistor constituting a circuit is different from that of the second standard cell. That is, the third standard cell has two or more MOS transistors which correspond to one MOS transistor that the second standard cell has, which have the same gate length as that of the first and second standard cells, which are connected in series, and have the gates connected in common. Accordingly, in the third standard cell, leak current becomes small although a circuit delay becomes large, as compared with the first and second standard cells, in a similar manner to that when a gate length is set large. Therefore, even when a gate length cannot be set large due to the design rule, for example, leak current can be suppressed without increasing a chip area, in a similar manner to that of the first mode.

According to one aspect of the present invention, a semiconductor integrated circuit device arrayed with plural standard cells includes a first standard cell that has a first cell width and that includes a first parallel transistor group including two or more MOS transistors having first gate lengths, connected in parallel, and having gates connected in common, as MOS transistors constituting a circuit, and a second standard cell that has the same logic as that of the first standard cell and has the first cell width, and that includes a second parallel transistor group corresponding to the first parallel transistor group, as MOS transistors constituting a circuit. The second parallel transistor group includes two or more MOS transistors connected in parallel, and having gates connected in common, and includes at least one MOS transistor having the parallel number smaller than that of the first parallel transistor group and having a second gate length larger than the first gate length.

According to this aspect, the semiconductor integrated circuit device includes the first and second standard cells that have the same logic. The first standard cell has a first parallel transistor group including two or more MOS transistors connected in parallel, and having gates connected in common. The second standard cell has the same cell width as that of the first standard cell, and has a second parallel transistor group corresponding to the first parallel transistor group. The second parallel transistor group includes two or more MOS transistors connected in parallel, and having gates connected in common, and has at least one MOS transistor having the parallel number smaller than that of the first parallel transistor group and having a gate length larger than that of the first parallel transistor group. Accordingly, in the second standard cell, leak current becomes small although a circuit delay becomes large, as compared with the first standard cell. Therefore, for example, by replacing the first standard cell in a path having room in timing with the second standard cell, leak current can be efficiently suppressed without increasing a chip area.

According to one aspect of the present invention, a semiconductor integrated circuit device arrayed with plural standard cells includes a first standard cell that has a first cell width and that includes a first parallel transistor group including two or more MOS transistors having first gate lengths, connected in parallel, and having gates connected in common, as MOS transistors constituting a circuit, and a second standard cell that has the same logic as that of the first standard cell and has the first cell width, and that includes a second parallel transistor group corresponding to the first parallel transistor group, as MOS transistors constituting a circuit. The second parallel transistor group has two or more series-connected MOS transistors connected in parallel and having gates connected in common, and has the parallel number smaller than that of the first parallel transistor group, with each MOS transistor having the first gate length.

According to this aspect, the semiconductor integrated circuit device includes the first and second standard cells that have the same logic. The first standard cell has a first parallel transistor group including two or more MOS transistors connected in parallel, and having gates connected in common. The second standard cell has the same cell width as that of the first standard cell and has a second parallel transistor group corresponding to the first parallel transistor group. The second parallel transistor group has two or more series-connected MOS transistors connected in parallel, and having gates connected in common, has the parallel number smaller than that of the first parallel transistor group, and has a gate length equal to that of the first parallel transistor group. Accordingly, in the second standard cell, leak current becomes small although the circuit delay becomes large, as compared with the first standard cell, in a similar manner to that when a gate length is set large. Therefore, even when a gate length cannot be set large due to the design rule, for example, leak current can be suppressed without increasing a chip area, in a similar manner to that in a third aspect.

According to the present invention, a semiconductor integrated circuit device has layout generated by combining plural standard cells in which layout such as a cell width and a gate length is properly adjusted. Therefore, leak current can be suppressed without increasing a chip area, and without turning back in a design.

BRIEF DESCRIPTION OF DRAWINGS

FIG. 1A is a plan view showing a layout example of a standard cell to be used in a semiconductor integrated circuit device according to a first exemplary embodiment;

FIG. 1B is a plan view showing a layout example of a standard cell to be used in a semiconductor integrated circuit device according to the first exemplary embodiment;

FIG. 1C is a plan view showing a layout example of a standard cell to be used in a semiconductor integrated circuit device according to the first exemplary embodiment;

FIG. 2 is a flowchart showing an example of a layout design method using the standard cells shown in FIGS. 1A, 1B, and 1C;

FIG. 4 is a plan view showing a layout example of other standard cell according to the first exemplary embodiment;

FIG. 6A is a plan view showing a layout example of a standard cell to be used in a semiconductor integrated circuit device according to a second exemplary embodiment;

FIG. 6B is a plan view showing a layout example of a standard cell to be used in a semiconductor integrated circuit device according to the second exemplary embodiment;

FIG. 8A is a plan view showing a layout example of a standard cell to be used in a semiconductor integrated circuit device according to a third exemplary embodiment;

FIG. 8B is a plan view showing a layout example of a standard cell to be used in a semiconductor integrated circuit device according to the third exemplary embodiment;

FIG. 12 is a plan view showing a layout example of other standard cell according to the third exemplary embodiment;

FIG. 13 is a plan view showing a layout example of other standard cell according to the third exemplary embodiment;

DETAILED DESCRIPTION OF THE PREFERRED EMBODIMENTS

Figure 3:
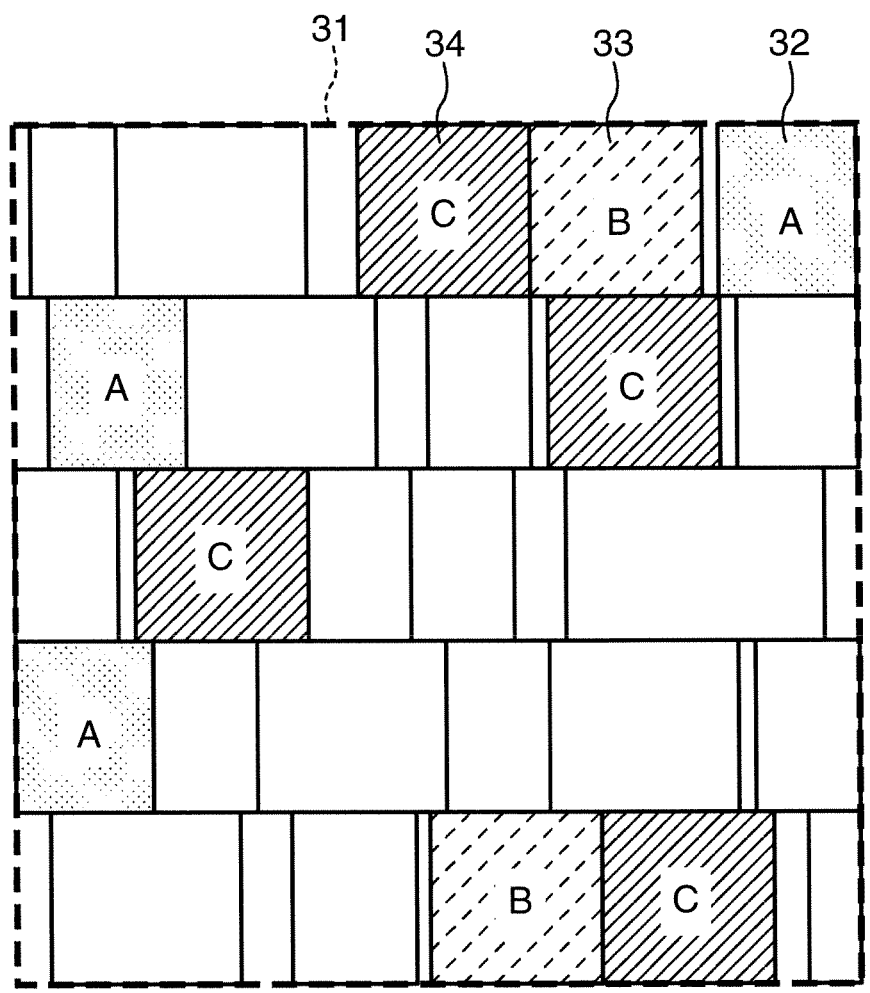
FIG. 3 is a conceptual view of layout of a semiconductor integrated circuit device using the standard cells shown in FIGS. 1A, 1B, and 1C.

Preferred exemplary embodiments of the present invention are described below with reference to the drawings.

First Exemplary Embodiment

FIGS. 1A, 1B, and 1C are plan views showing layout examples of a standard cell to be used in a semiconductor integrated circuit device according to a first exemplary embodiment. Cell A-1 in FIG. 1A, cell B-1 in FIG. 1B, and cell C-1 in FIG. 1C are all standard cells of the same logic, and show examples of a two-input NAND cell in this case.

In FIGS. 1A, 1B, and 1C, 11 denotes a gate of a MOS transistor, 12 denotes a contact, 13 denotes a P-type diffusion region, 14 denotes an N-type diffusion region, 15 denotes a first layer metal, 16 denotes a via that connects between the first layer metal and a second layer metal, 17 denotes the second layer metal, and 18 denotes an N-well region. Contact 12 connects between the gate or a diffusion layer and the first layer metal. As circuit elements, 21 denotes a power source line to which a power source potential is supplied, 22 denotes a ground line, 23 denotes a terminal wiring that becomes an input terminal (IN1), 24 denotes a terminal wiring that becomes an input terminal (IN2), and 25 denotes a terminal wiring that becomes an output terminal (OUT). Power source line 21 and ground line 22 are formed on first layer metal 15, and terminal wirings 23, 24, and 25 are formed on second layer metal 17. CL denotes a cell frame.

Cell A-1 in FIG. 1A has cell width W1, and a gate length of a MOS transistor that constitutes a circuit is L1. In this case, gate length L1 is assumed as a minimum value that is prescribed by the design rule. That is, cell A-1 is a general standard cell that is laid out by prioritizing the minimum value prescribed by the design rule, and is designed such that a delay time of the circuit becomes minimum. A PMOS transistor is laid out to have gate width Wp1, and an NMOS transistor is laid out to have gate width Wn1.

On the other hand, cell B-1 in FIG. 1B is designed such that a gate length and a gate width become equal to those of cell A-1 and that a delay time of the circuit becomes the same as that of cell A-1. However, a main difference is that cell B-1 has a cell width larger than that of cell A-1. That is, cell B-1 has cell width W2 larger than W1 (W2>W1), a gate length of a MOS transistor that constitutes a circuit is L1 which is the same as the gate length of cell A-1, a gate width of the PMOS transistor is Wp1, and a gate width of the NMOS transistor is Wn1.

In the examples of FIGS. 1A, 1B, and 1C, cell A-1 and cell B-1 are laid out such that, in addition to a gate width, an interval between adjacent gates, a shape of a gate, shapes of an N-type diffusion region and a P-type diffusion region, and a positional relationship between a gate and a contact are all the same. By providing the layout in this way, a characteristic difference of a MOS transistor due to an influence of a layout shape can be made much smaller, and delay times of cell A-1 and cell B-1 can be set the same. However, because delay times of cell A-1 and cell B-1 are not necessarily required to be set strictly the same, a gate width, a gate interval, a gate shape, shapes of diffusion regions, and a positional relationship between a gate and a contact are not necessarily required to be set all the same.

Further, cell C-1 in FIG. 1C is designed such that a gate length of a MOS transistor constituting a circuit becomes large, such that leak current can be suppressed although a delay time of the circuit becomes large, as compared with cell B-1. That is, cell C-1 has cell width W2 which is the same as the cell width of cell B-1, and a gate length of a MOS transistor constituting a circuit is L2 which is larger than L1 (L2>L1).

Further, in the examples of FIGS. 1A, 1B, and 1C, cell B-1 and cell C-1 are laid out such that a positional of terminal wirings 23 to 25 and a positional of vias 16 that are connected to terminal wirings 23 to 25 are the same. By providing the layout in this way, after performing wiring to input/output terminals, replacement of cell B-1 with cell C-1 can be achieved without redoing the wiring.

In FIGS. 1A, 1B, and 1C, terminal wirings 23 to 25 are extended to a vertical direction (a Y direction) in the drawings. In this case, regarding terminal wirings 23 to 25, even when there is some deviation of a position in the vertical direction in the drawings, connection with the input/output wirings becomes easy, by slightly changing a length of a second layer metal in a vertical direction, for example. Therefore, to facilitate replacement of cell B-1 with cell C-1, regarding terminal wirings 23 to 25, it is sufficient that a positional relationship in a lateral direction (an X direction) in the drawings, that is, in a direction perpendicular to a direction to which terminal wirings 23 to 25 are extended is the same. Similarly, when the terminal wirings are extended to a lateral direction in the drawings, it is preferable that a positional relationship in a vertical direction in the drawings is the same.

FIG. 2 is a flowchart showing an example of a layout design method for a semiconductor integrated circuit device using standard cells shown in FIGS. 1A, 1B, and 1C. The layout design method shown here is just an example, and other methods may be employed.

In database 41 of a standard cell library, cells A of various basic circuits that have characteristics similar to those of cell A-1 shown in FIG. 1A are stored. Cells B of various basic circuits that have characteristics similar to those of cell B-1 shown in FIG. 1B are stored in database 42 of the standard cell library. Cells C of various basic circuits that have characteristics similar to those of cell C-1 shown in FIG. 1C are stored in database 43 of the standard cell library.

First, at step S101, by using cells A stored in database 41, the cells are automatically arrayed in a standard-cell array region. At step S102, wiring for connecting input/output terminals of arrayed cells A is performed.

In the standard-cell array region after array and wiring at steps S101, and S102, cells A are arranged to have no gap as far as possible. However, at portions where wirings are congested, it is necessary to provide a space for intervals between adjacent cells A to pass connection wirings of input/out terminals. In general, a space area is present by about 10% to 30% of the standard-cell array region. By using the space area, at step S104 described later, cells A are replaced with cells B of a larger area, without increasing an area of the standard-cell array region.

At step S103, when there are space areas that are locally pooled, cells A are re-arrayed, and the space areas are dispersed. This is for the purpose of more effectively using the space area to make it possible to replace as many cells A as possible with cells B, and minimize change of wiring paths as far as possible.

At step S104, cells A that are adjacent to the space area are replaced with cells B, by using cells B stored in database 42. In this case, because circuit delay times of cells A and cells B are the same, there is no influence on timing due to the replacement of the cells. At step S105, wiring for connecting input/output terminals of cells B is performed. At step S106, power consumption of cells A and cells B after re-array and re-wiring, and a voltage drop amount generated by a resistance of a power source wiring are calculated.

At step S107, timing verification is performed, by taking into account delay times of cells A and cells B, delay times due to resistances and capacitances of wirings for connecting input/output terminals of cells, and variations of delay times due to a voltage drop.

At step S108, cells B present in a path where there is room for timing are replaced with cells C, by using cells C stored in database 43, by using a result of the timing verification at step S107. With this arrangement, leak current can be suppressed, without increasing an area of the standard-cell array region.

FIG. 3 is a conceptual view of layout of a semiconductor integrated circuit device using the standard cells shown in FIGS. 1A, 1B, and 1C. In FIG. 3, three kinds of standard cells 32, 33, and 34 of the same logic are arrayed in a mix in standard cell array region 31. Standard cells 32, 33, and 34 have layout in FIGS. 1A, 1B, and 1C, respectively. When the semiconductor integrated circuit device is designed by the layout design method as shown in FIG. 2, for example, out of cells A that are arrayed at step S101, cells A to which a space area is adjacent are replaced with cells B at step S104. Further, cells B that are present in a path having room in timing are replaced with cells C at step S108. As a result, in standard-cell array region 31, cells A (standard cell 32), cells B (standard cells 33), and cells C (standard cells 34) are arrayed in a mix. In the semiconductor integrated circuit device shown in FIG. 3, leak current is suppressed, without increasing an area of standard-cell array region 31.

As described above, according to the present embodiment, as standard cells of the same logic, cells A, cells B, and cells C of which cell widths and gate lengths are properly adjusted are arrayed in the semiconductor integrated circuit device. With this arrangement, leak current can be suppressed without increasing a chip area. After cells B are arrayed and wired, cells B can be replaced with cells C without redoing designing.

(Example of Other Standard Cells)

FIG. 4 is a plan view showing a layout example of another standard cell according to the present exemplary embodiment. Cell C-2 shown in FIG. 4 is a standard cell of the same logic as that in FIGS. 1A to 1C, and is a two-input NAND cell. Cell C-2 has cell width W2 which is the same as the cell of cell B-1 shown in FIG. 1B. A gate length of a MOS transistor that constitutes a circuit is L1 for PMOS transistor 51 and NMOS transistor 81, and is L2 which is larger than L1 for PMOS transistor 52 and NMOS transistor 82. By using cell C-2 according to a need of replacement with cell B-1, at step S108 in the flow in FIG. 2 described above, for example, increase of a delay time and leak current can be suppressed in more detail.

Figure 5:
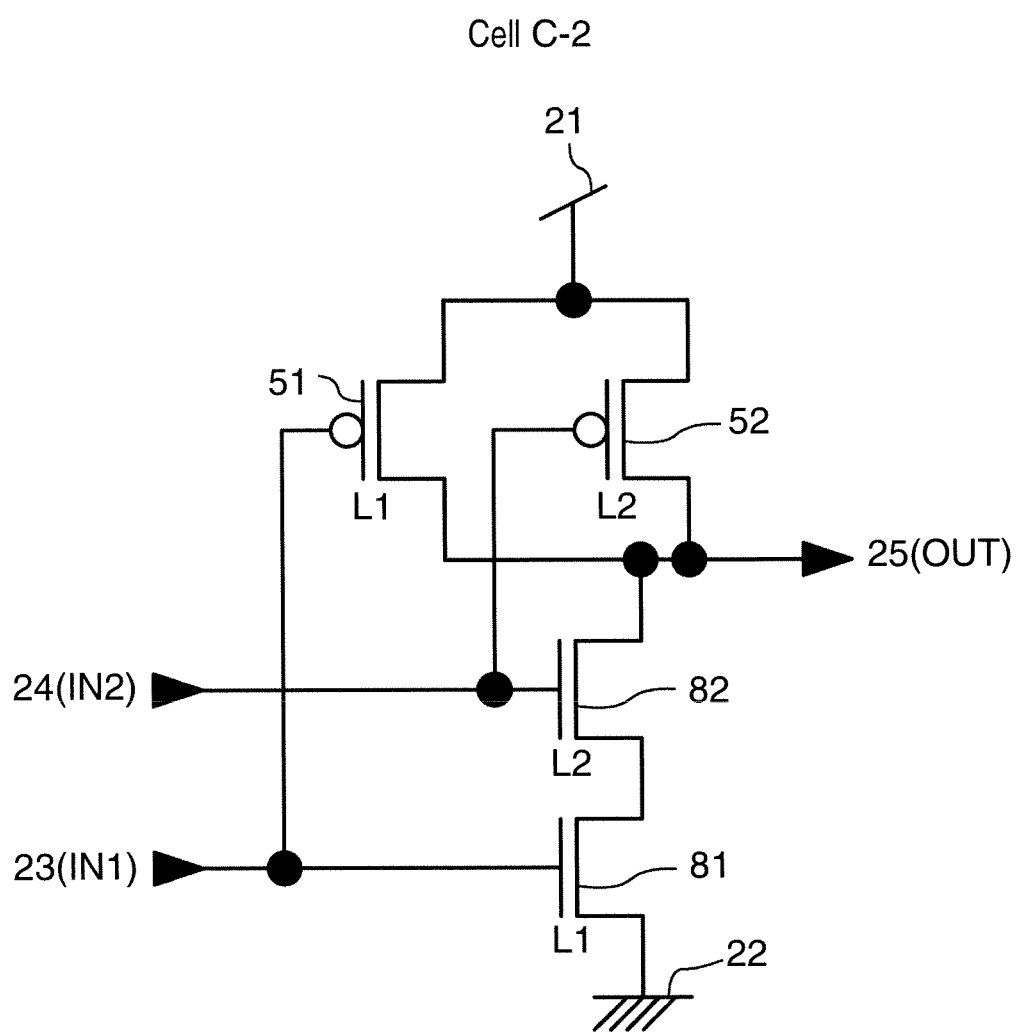
FIG. 5 is a circuit diagram of the standard cell shown in FIG. 4.

FIG. 5 is a circuit diagram corresponding to layout of cell C-2 in FIG. 4. In FIG. 5, reference symbols that are the same as those in FIG. 4 are attached to constituent elements that are common to those in FIG. 4. A gate length of PMOS transistor 51 and NMOS transistor 81 is L1. Because on-current is large, a delay time when a circuit operates based on a signal inputted to input terminal IN1 is small. On the other hand, because a gate length of PMOS transistor 52 and NMOS transistor 82 is L2 and because on-current is small, a delay time when the circuit operates based on a signal inputted to input terminal IN2 becomes large by a small portion of on-current. However, when NMOS transistor 82 is off and when the circuit is stationary, leak current is more suppressed corresponding to a large portion of gate length L2.

In this way, leak current can be suppressed more properly in the semiconductor integrated circuit device, by using standard cells of which gate lengths are different at a circuit portion where a high performance is necessary and at a circuit portion where leak current is desired to be suppressed.

Second Exemplary Embodiment

FIGS. 6A and 6B are plan views showing layout examples of a standard cell to be used in a semiconductor integrated circuit device according to a second exemplary embodiment. Cell B-2 in FIG. 6A and cell C-3 in FIG. 6B are standard cells of the same logic as that of cell A-1 and the like shown in FIGS. 1A to 1C, and are two-input NAND cells. In FIGS. 6A and 6B, constituent elements that are common to those in FIGS. 1A to 1C are attached with the same reference symbols as those in FIG. 1, and their detailed description is omitted here.

Cell B-2 in FIG. 6A is designed such that a gate length and a gate width are equal to those of cell A-1 in FIG. 1A and that a delay time of the circuit is the same as that of cell A-1. However, a main difference is that cell B-2 has a cell width larger than that of cell A-1. That is, cell B-2 has cell width W3 larger than W1 (W3>W1), a gate length of a MOS transistor that constitutes a circuit is L1 which is the same as the gate length of cell A-1, a gate width of PMOS transistors 53 and 54 is Wp1, and a gate width of the NMOS transistor is Wn1.

Further, in the examples of FIGS. 6A and 6B, cell B-2 is laid out such that, in addition to a gate width, an interval between adjacent gates, a shape of a gate, shapes of an N-type diffusion region and a P-type diffusion region, and a positional relationship between a gate and a contact are all the same as those of cell A-1 in FIG. 1A. By providing the layout in this way, a characteristic difference of a MOS transistor due to an influence of a layout shape can be made much smaller, and delay times of cell A-1 and cell B-2 can be set the same. However, because delay times of cell A-1 and cell B-2 are not necessarily required to be set strictly the same, a gate width, a gate interval, a gate shape, shapes of diffusion regions, and a positional relationship between a gate and a contact are not necessarily required to be set all the same.

Further, cell C-3 in FIG. 6B is configured such that a MOS transistor constituting a circuit is changed to two-divided MOS transistors connected in series, such that leak current can be suppressed although a delay time of the circuit becomes large, as compared with cell B-2. For example, PMOS transistor 53 of cell B-2 is replaced with two PMOS transistors 53a and 53b which are connected in series and of which gates are connected in common to input terminal IN1 in cell C-3. Similarly, PMOS transistor 54 is replaced with two PMOS transistors 54a and 54b, NMOS transistor 83 is replaced with two NMOS transistor 83a and 83b, and NMOS transistor 84 is replaced with two NMOS transistors 84a and 84b. However, cell C-3 has cell width W3 which is the same as the cell width of cell B-2, and gate length of each MOS transistor is L1 which is the same as the gate length of cell B-2. With this arrangement, cell B-2 and cell C-3 can be replaced with each other without changing an area.

Figure 7A:
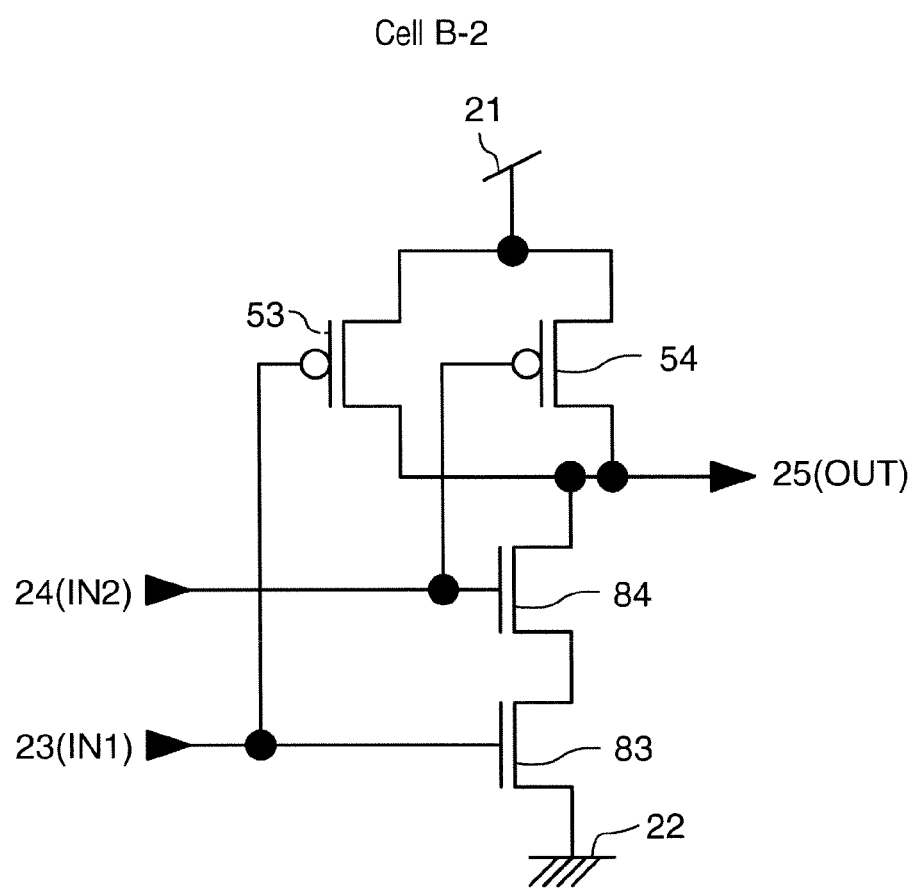
FIG. 7A is a circuit diagram of the standard cell shown in FIG. 6A.
Figure 7B:
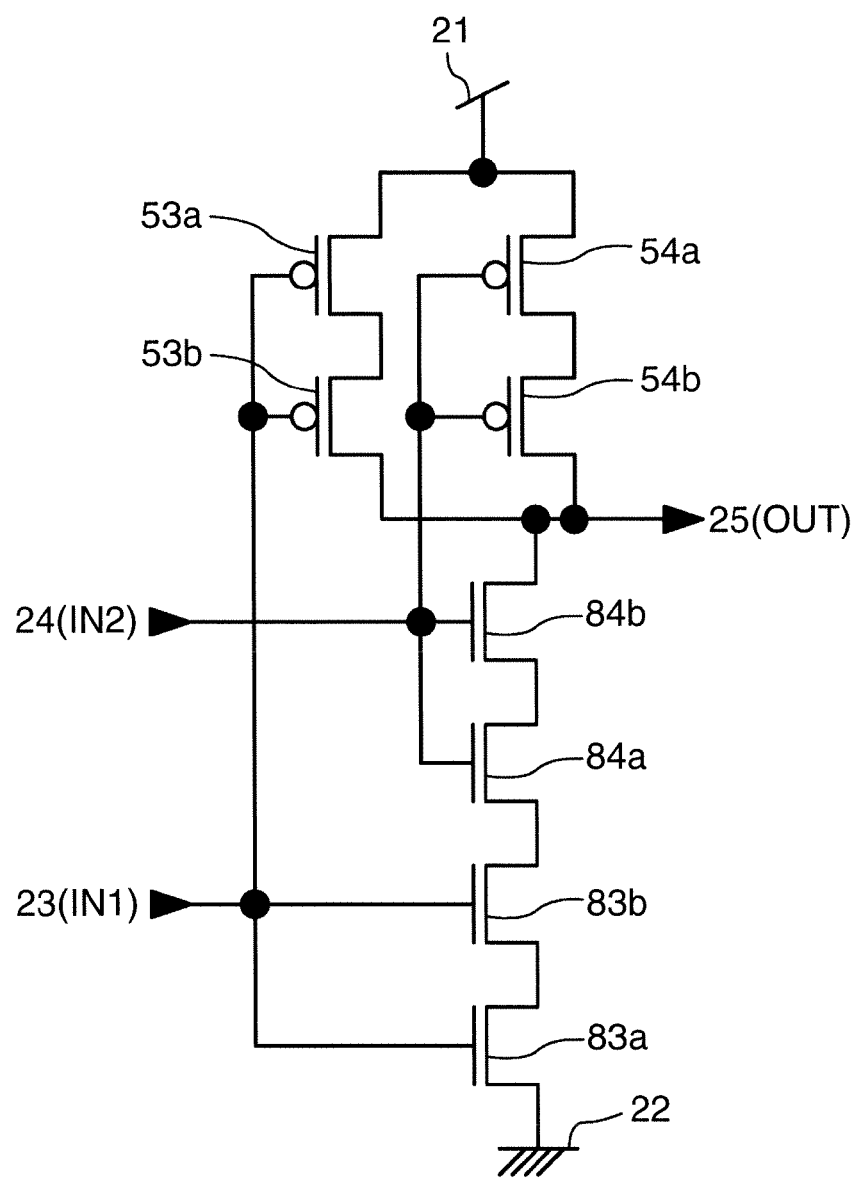
FIG. 7B is a circuit diagram of the standard cell shown in FIG. 6B.

FIGS. 7A and 7B are circuit diagrams corresponding to layout of cell B-2 in FIG. 6A and cell C-3 in FIG. 6B. In FIGS. 7A and 7B, constituent elements that are common to those in FIGS. 6A and 6B are attached with the same reference symbols as those in FIGS. 6A and 6B. As is clear from comparison between FIG. 7A and FIG. 7B, a series connection of PMOS transistors 53a and 53b of which gates are connected in common in cell C-3 corresponds to PMOS transistor 53 in cell B-2. In this case, "corresponds to MOS transistor" means that in a circuit configuration of a standard cell, the same circuit portion as that of the MOS transistor is achieved. Similarly, a series connection of PMOS transistors 54a and 54b of which gates are connected in common in cell C-3 corresponds to PMOS transistor 54 in cell B-2. A series connection of NMOS transistors 83a and 83b of which gates are connected in common in cell C-3 corresponds to NMOS transistor 83 in cell B-2. A series connection of NMOS transistors 84a and 84b of which gates are connected in common in cell C-3 corresponds to NMOS transistor 84 in cell B-2. By providing a circuit configuration like this, cell C-3 can suppress leak current to the same level as that achieved by doubling gate length L1 of cell B-2.

By using the standard cells as shown in FIGS. 6A and 6B, and by achieving the layout design method as shown in FIG. 2, for example, leak current of the semiconductor integrated circuit device can be suppressed, without increasing a layout area. Further, because a gate length is not large in the standard cells in FIGS. 6A and 6B, even when enlarging a gate length is prohibited by the design rule, and even when a gate length needs to be arranged, for example, an effect of leak current suppression can be obtained in a similar manner to that when a gate length is set large.

In FIGS. 6A and 6B, terminal wirings 23 to 25 are extended to a vertical direction (a Y direction) in the drawings. In this case, regarding terminal wirings 23 to 25, even when there is some deviation of a position in the vertical direction in the drawings, connection with the input/output wirings becomes easy, by slightly changing a length of a second layer metal in a vertical direction, for example. Therefore, to facilitate a replacement of cell B-2 with cell C-3, regarding terminal wirings 23 to 25, it is sufficient that a positional relationship in a lateral direction (an X direction) in the drawings, that is, in a direction perpendicular to a direction to which terminal wirings 23 to 25 are extended is the same. Similarly, when the terminal wirings are extended to a lateral direction in the drawings, it is preferable that a positional relationship in a vertical direction in the drawings is the same.

In FIGS. 6A and 6B, although all MOS transistors in cell B-2 are replaced with a series connection of two MOS transistors of which gates are connected in common in cell C-3, replacement is not limited to this example. For example, an effect of leak current suppression can be also obtained even by replacing only a part of MOS transistors the cell B-2 has. Further, MOS transistors in cell B-2 may be replaced with a series connection of three or more MOS transistors of which gates are connected in common.

Third Exemplary Embodiment

FIGS. 8A and 8B are plan views showing layout examples of a standard cell to be used in a semiconductor integrated circuit device according to a third exemplary embodiment. Cell A-2 in FIG. 8A and cell D-1 in FIG. 8B are standard cells of the same logic, and show examples of an inverter cell in this case.

Figure 11:
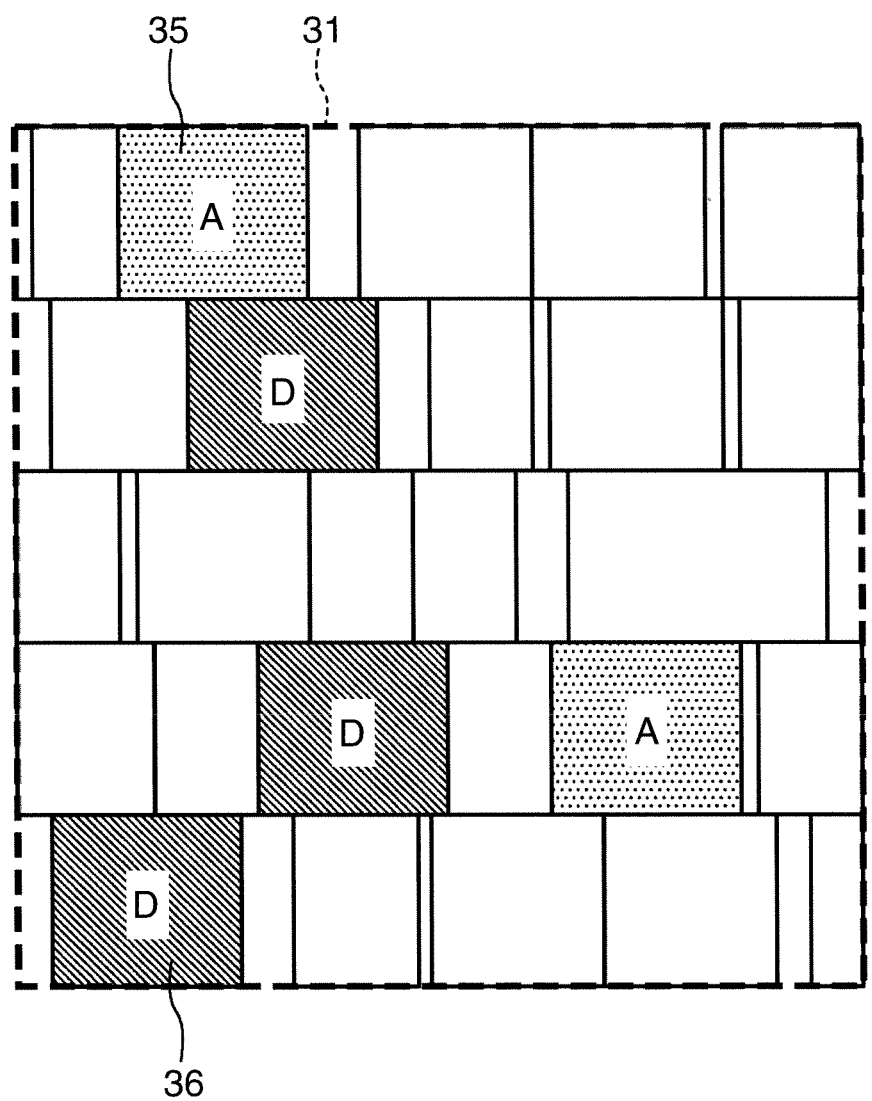
FIG. 11 is a conceptual view of layout of a semiconductor integrated circuit device using the standard cells shown in FIGS. 8A, 8B, and 8C.

In FIGS. 8A and 8B, 11 denotes a gate of a MOS transistor, 12 denotes a contact, 13 denotes a P-type diffusion region, 14 denotes an N-type diffusion region, 15 denotes a first layer metal, 16 denotes a via that connects between the first layer metal and a second layer metal, 17 denotes the second layer metal, and 18 denotes an N-well region. Contact 12 connects between the gate or a diffusion layer and the first layer metal. As circuit elements, 21 denotes a power source line to which a power source potential is supplied, 22 denotes a ground line, 26 denotes a terminal wiring that becomes an input terminal (IN), 27 denotes a terminal wiring that becomes an output terminal (OUT). Power source line 21 and ground line 22 are formed on first layer metal 15, and terminal wirings 26 and 27 are formed on second layer metal 17. CL denotes a cell frame.

Cell A-2 in FIG. 8A has cell width W4, and a gate length of a MOS transistor that constitutes a circuit is L1. In this case, gate length L1 is assumed as a minimum value that is prescribed by the design rule. That is, cell A-2 is a general standard cell that is laid out by prioritizing the minimum value prescribed by the design rule, and is designed such that a delay time of the circuit becomes minimum. Four PMOS transistors 60, 61, 62, and 63 are connected in parallel, and gates are connected in common. Four NMOS transistors 90, 91, 92, and 93 are connected in parallel, and gates are connected in common. In other words, cell A-2 has layout that four inverters including the PMOS transistors and the NMOS transistors are connected in parallel.

On the other hand, cell D-1 in FIG. 8B is designed such that a gate length of a MOS transistor constituting a circuit becomes large, such that leak current can be suppressed although a delay time of the circuit becomes large, as compared with cell A-2. That is, cell D-1 has cell width W4 which is the same as the cell width of cell A-2, and a gate length of a MOS transistor constituting a circuit is L2 which is larger than L1 (L2>L1). Further, three PMOS transistors 64, 65, and 66 are connected in parallel, and gates are connected in common. Three NMOS transistors 94, 95, and 96 are also connected in parallel, and gates are connected in common. In other words, cell D-1 has layout that three inverters which include PMOS transistors and NMOS transistors and have a smaller parallel number than that of MOS transistors of cell A-2, are connected in parallel.

Figure 9A:
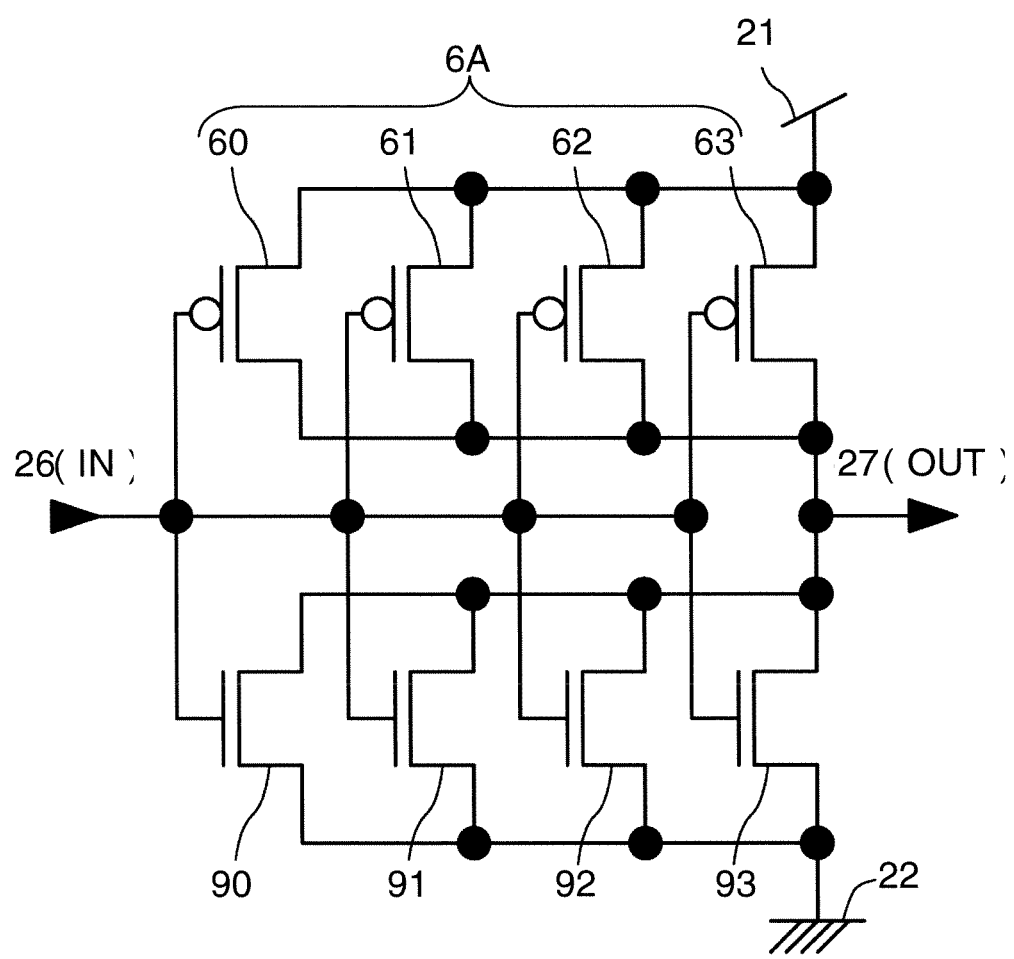
FIG. 9A is a circuit diagram of the standard cell shown in FIG. 8A.
Figure 9B:
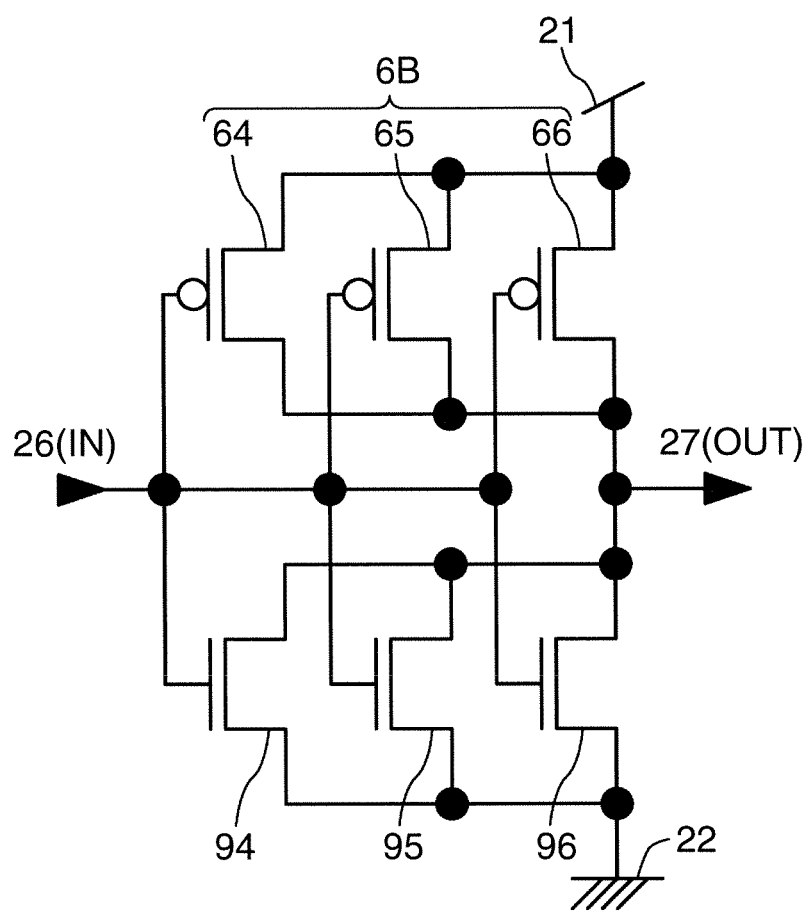
FIG. 9B is a circuit diagram of the standard cell shown in FIG. 8B.

FIGS. 9A and 9B are circuit diagrams corresponding to layout of cell A-2 in FIG. 8A and cell D-1 in FIG. 8B. In FIGS. 9A and 9B, constituent elements that are common to those in FIGS. 8A and 8B are attached with the same reference symbols as those in FIGS. 8A and 8B. As is clear from comparison between FIG. 9A and FIG. 9B, second parallel transistor group 6B in cell D-1 corresponds to first parallel transistor group 6A in cell A-2. In this case, "corresponds to parallel transistor group" means that in a circuit configuration of a standard cell, the same circuit portion as that of the parallel transistor group is achieved. The parallel number of first parallel transistor groups 6A in cell A-2 is four, and a gate length of PMOS transistors 60, 61, 62, and 63 is L1. The parallel number of second parallel transistor groups 6B in cell D-1 is three, and a gate length of PMOS transistors 64, 65, and 66 is L2 which is larger than L1. NMOS transistors also have similar configurations. In the examples of FIGS. 8A and 8B, cell A-2 and cell D-1 are laid out such that a positional of terminal wirings 26 and 27 and a positional of vias that are connected to terminal wirings 26 and 27 are the same. By providing the layout in this way, after performing wiring to input/output terminals, replacement of cell A-2 with cell D-1 can be achieved without redoing the wiring.

In FIGS. 8A and 8B, terminal wirings 26 and 27 are extended to a vertical direction (a Y direction) in the drawings. In this case, regarding terminal wirings 26 and 27, even when there is some deviation of a position in the vertical direction in the drawings, connection with the input/output wirings becomes easy, by slightly changing a length of a second layer metal in a vertical direction, for example. Therefore, to facilitate replacement of cell A-2 with cell D-1, regarding terminal wirings 26 and 27, it is sufficient that a positional relationship in a lateral direction (an X direction) in the drawings, that is, in a direction perpendicular to a direction to which terminal wirings 23 to 25 are extended is the same. Similarly, when the terminal wirings are extended to a lateral direction in the drawings, it is preferable that a positional relationship in a vertical direction in the drawings is the same.

Figure 10:
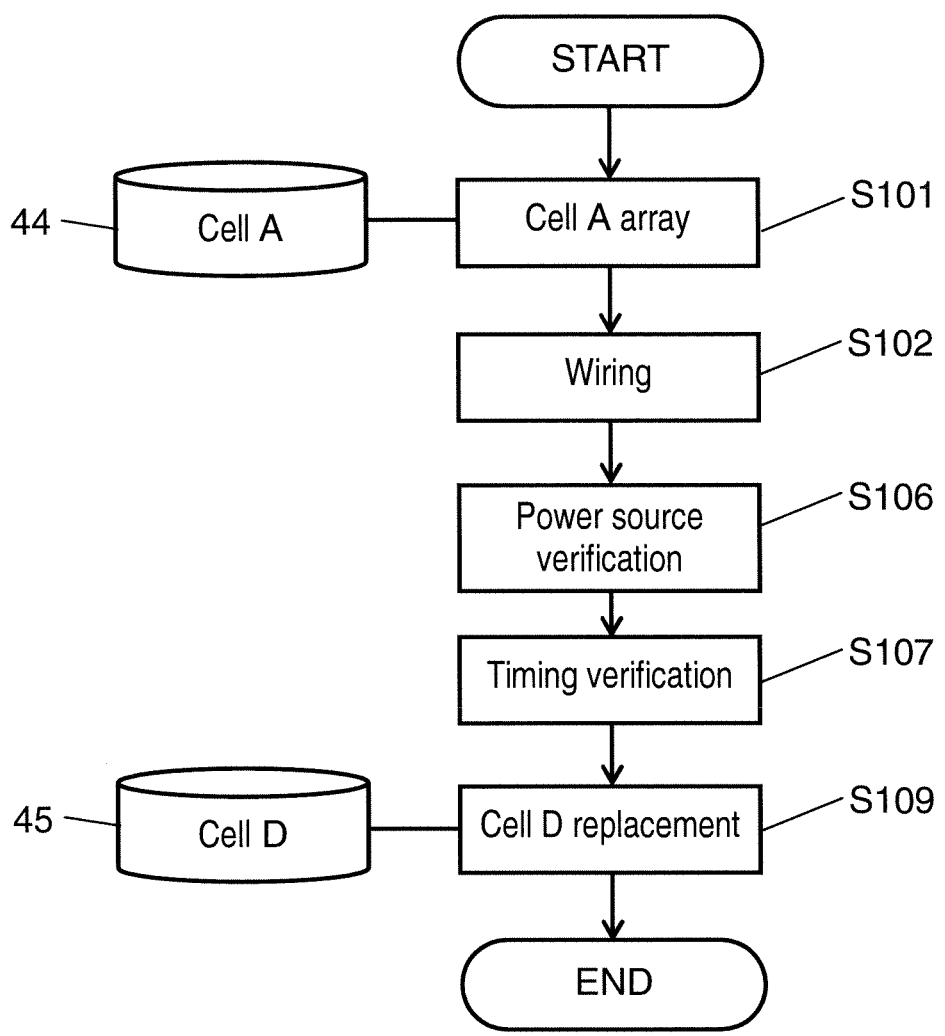
FIG. 10 is a flowchart showing an example of a layout design method using the standard cells shown in FIGS. 8A and 8B.

FIG. 10 is a flowchart showing an example of a layout design method for a semiconductor integrated circuit device using standard cells shown in FIGS. 8A and 8B. The layout design method shown here is just an example, and other methods may be employed.

In database 44 of a standard cell library, cells A of various basic circuits that have characteristics similar to those of cell A-2 shown in FIG. 8A are stored. Cells D of various basic circuits that have characteristics similar to those of cell D-1 shown in FIG. 8B are stored in database 45 of the standard cell library.

First, at step S101, by using cells A stored in database 44, the cells are automatically arrayed in a standard-cell array region. At step S102, wiring for connecting input/output terminals of arrayed cells A is performed.

At step S106, power consumption of cells A after array and wiring, and a voltage drop amount generated by a resistance of a power source wiring are calculated.

At step S107, timing verification is performed, by taking into account delay times of cells A, delay times due to resistances and capacitances of wirings for connecting input/output terminals of cells, and variations of delay times due to a voltage drop.

At step S109, cells A present in a path where there is room for timing are replaced with cells D, by using cells D stored in database 45, by using a result of the timing verification at step S107. With this arrangement, leak current can be suppressed without increasing an area of the standard-cell array region.

According to the layout design method in FIG. 10, steps S103, S104, and S105 become unnecessary and a design time can be shortened, as compared with the layout design method in FIG. 2 described in the first exemplary embodiment.

FIG. 11 is a conceptual view of layout of a semiconductor integrated circuit device using the standard cells shown in FIGS. 8A and 8B. In FIG. 11, two kinds of standard cells 35 and 36 of the same logic are arrayed in a mix in standard cell array region 31. Standard cells 35 and 36 have layout in FIGS. 8A and 8B, respectively. When the semiconductor integrated circuit device is designed by the layout design method as shown in FIG. 10, for example, out of cells A that are arrayed at step S101, cells B that are present in a path having room in timing are replaced with cells D at step S109. As a result, in standard-cell array region 31, cells A (standard cell 35) and cells D (standard cells 36) are arrayed in a mix.

As described above, according to the present exemplary embodiment, cells A and cells D that have circuit portions in which MOS transistors are connected in parallel as standard cells of the same logic and that have properly adjusted layout of parallel numbers and gate length, etc. of MOS transistors are arrayed in the semiconductor integrated circuit device. With this arrangement, leak current can be suppressed without increasing a chip area. After cells A are arrayed and wired, the cells can be replaced with cells D, without redoing the designing.

In the examples in FIGS. 8A and 8B and FIGS. 9A and 9B, regarding all parallel transistor groups in cells A-2, parallel numbers are set small and gate lengths are increased in cells D-1. However, changes are not limited to the above. For example, parallel numbers can be set small and gate lengths can be increased for only PMOS transistors, out of the parallel transistor groups in cells A-2.

(Part One of Examples of Other Standard Cells)

FIG. 12 is a plan view showing a layout example of other standard cell according to the present exemplary embodiment. Cell D-2 shown in FIG. 12 is a standard cell of the same logic as that in FIGS. 8A and 8B, and is an inverter cell. Cell D-2 has cell width W4 which is the same as that of cell A-2 in FIG. 8A, and has substantially similar layout to that of cell D-1 in FIG. 8B. That is, cell D-2 has layout that three inverters which include PMOS transistors and NMOS transistors and have a smaller parallel number than that of MOS transistors of cell A-2 are connected in parallel.

However, in cell D-2, a gate length of transistors 64 and 94 is L1. That is, a parallel transistor group has MOS transistors 64 and 94 of which a gate length is equal to L1, in addition to MOS transistors 65, 66, 95, and 96 of which a gate length is L2 which is larger than L1.

Leak current of cell D-2 is a total of leak current of the three inverters that are connected in parallel, and a delay time of cell D-2 is determined from a total of on-current of the three inverters that are connected in parallel. Therefore, in the parallel transistor group, leak current and a delay time of cell D-2 can be adjusted, by changing numbers of MOS transistors of gate length L1 and MOS transistors of gate length L2 which is larger than L1.

In this way, by using standard cells in which gate lengths of MOS transistors in the parallel transistor group are individually adjusted, an increase quantity of a delay time and a suppression quantity of leak current can be adjusted in detail in the semiconductor integrated circuit device.

(Part Two of Examples of Other Standard Cells)

FIG. 13 is a plan view showing a layout example of other standard cell according to the present exemplary embodiment. Cell D-3 shown in FIG. 13 is a standard cell of the same logic as that in FIGS. 8A and 8B, and is an inverter cell. Cell D-3 has cell width W4 which is the same as that of cell A-2 in FIG. 8A, and includes four PMOS transistors 67a, 67b, 68a, and 68b of gate length L1, and four NMOS transistor 97a, 97b, 98a, and 98b of gate length L1, in a similar manner to that of cell A-2 in FIG. 8A.

However, in cell D-3, two series-connected PMOS transistors 67a and 67b and two series-connected PMOS transistors 68a and 68b are connected in parallel, and gates are connected in common. Further, two series-connected NMOS transistors 97a and 97b and two series-connected NMOS transistors 98a and 98b are connected in parallel, and gates are connected in common. That is, in cell D-3, the parallel number of MOS transistors is smaller than that in cell A-2, and one MOS transistor is replaced with a series connection of two MOS transistors of which gates are connected in common. By setting the same cell width by decreasing the parallel number, cell A-2 and cell D-3 can be replaced with each other without changing an area.

Figure 14:
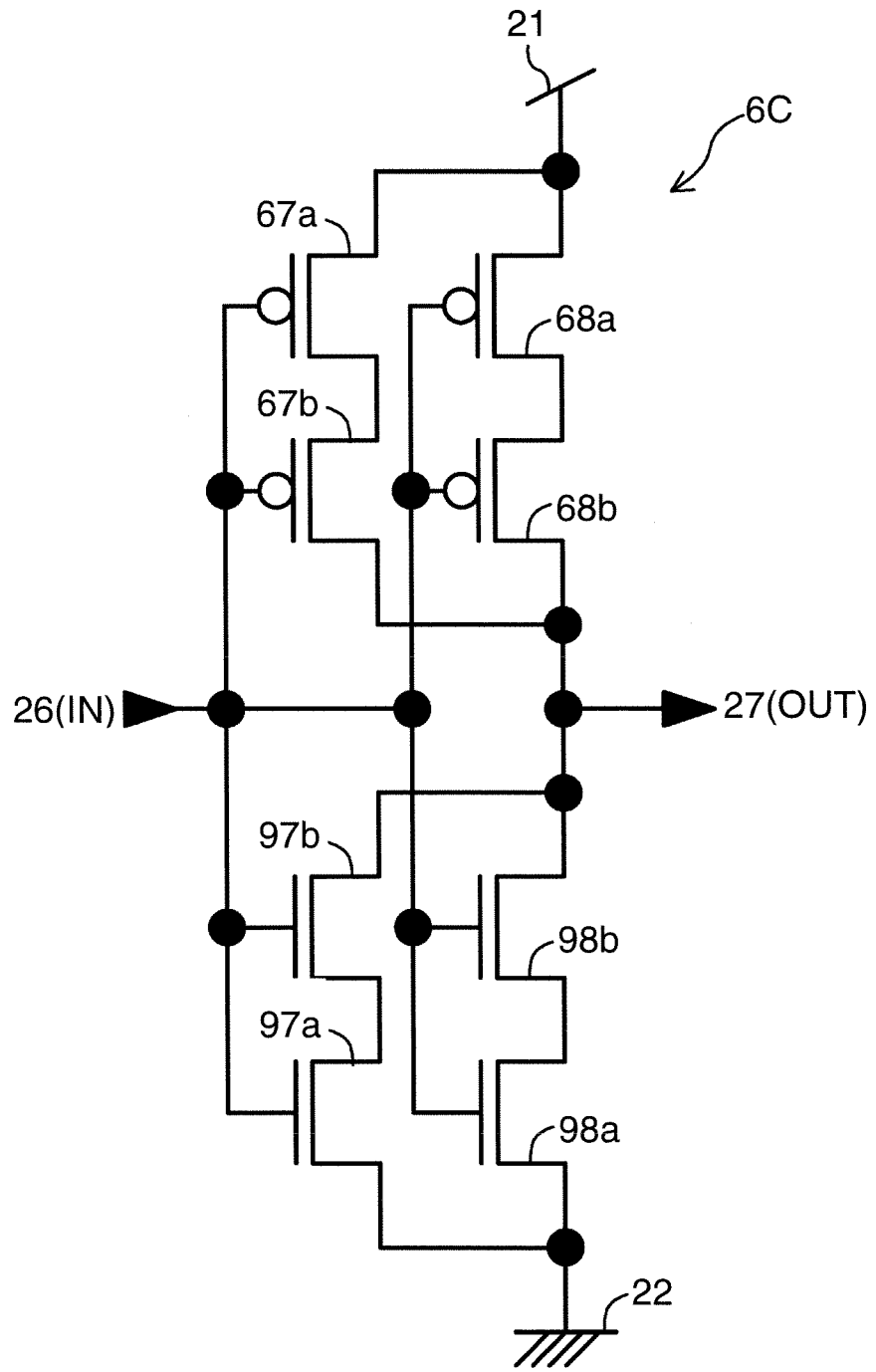
FIG. 14 is a circuit diagram of the standard cell shown in FIG. 13.
Figure 15A:
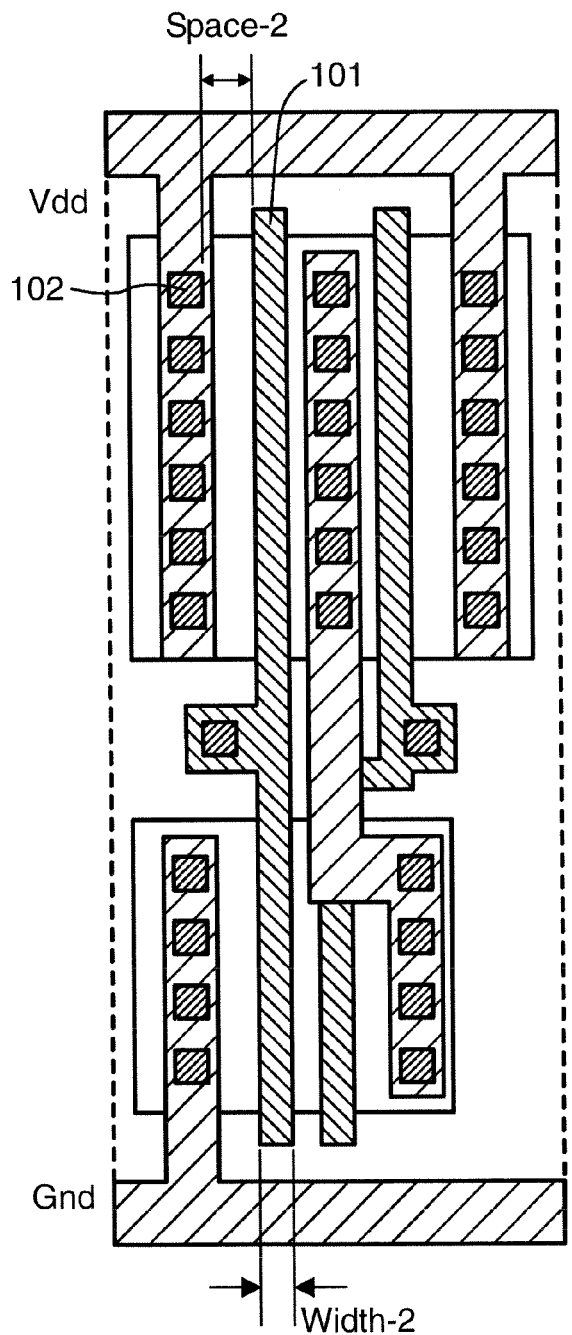
FIG. 15A is a view showing an example of layout of a standard cell according to a conventional technique.
Figure 15B:
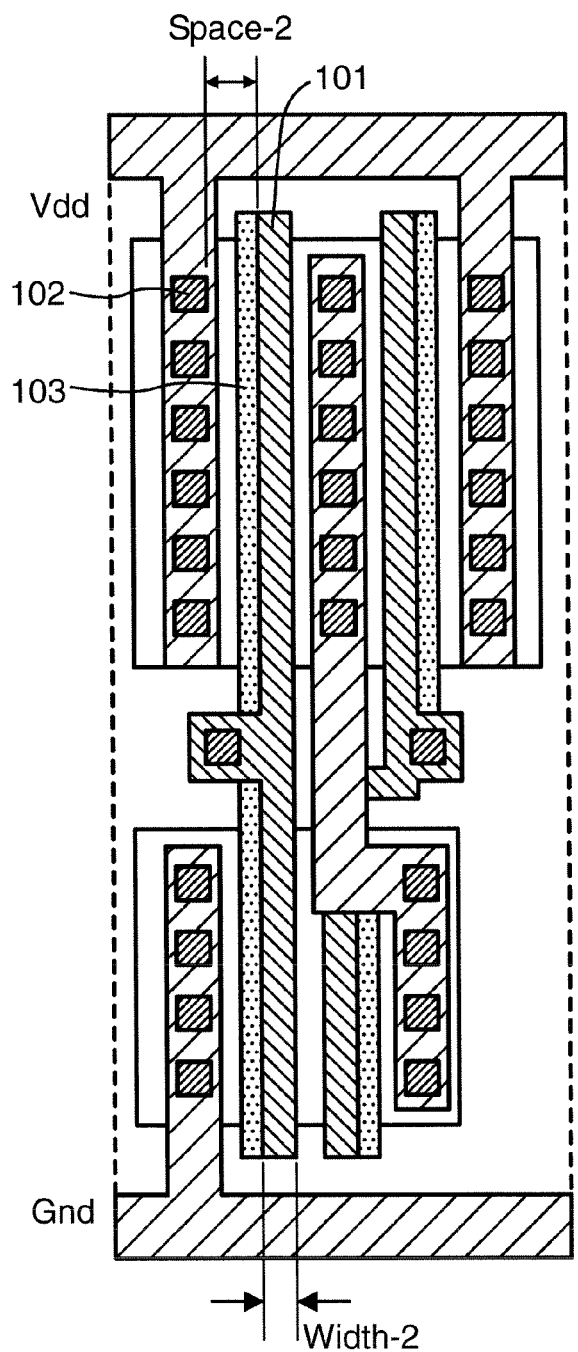
FIG. 15B is a view showing an example of layout of a standard cell according to a conventional technique.

FIG. 14 is a circuit diagram corresponding to layout of cell D-3 in FIG. 13. In FIG. 14, constituent elements that are common to those in FIG. 13 are attached with the same reference symbols as those in FIG. 13. As is clear from comparison between FIG. 9A and FIG. 14, second parallel transistor group 6C in cell D-3 corresponds to first parallel transistor group 6A in cell A-2. In cell A-2, the parallel number is four in first parallel transistor group 6A. On the other hand, in cell D-3, the parallel number is two in second parallel transistor group 6B, and a series connection of two MOS transistors of which gates are connected in common is arrayed instead of one MOS transistor. NMOS transistors also have a similar configuration. By providing a circuit configuration like this, cell D-3 can suppress leak current to the same level as that achieved by decreasing the parallel number of an inverter to a half, by doubling gate length L1 of cell A-2.

By using cell D-3 as shown in FIG. 13 and by achieving the layout design method as shown in FIG. 10, for example, leak current of the semiconductor integrated circuit device can be suppressed without increasing a layout area. Further, because a gate length is not large in cell D-3 in FIG. 13, even when enlarging a gate length is prohibited by the design rule, and even when a gate length needs to be arranged, for example, an effect of leak current suppression can be obtained in a similar manner to that when a gate length is set large.

Further, in the example of FIG. 13, cell A-2 and cell D-3 are laid out such that a positional of terminal wirings 26 and 27 and a positional of vias 16 that are connected to terminal wirings 26 and 27 are the same. By providing the layout in this way, after performing wiring to input/output terminals, replacement of cell A-2 with cell D-3 can be achieved without redoing the wiring.

Further, in FIG. 13, terminal wirings 26 and 27 are extended to a vertical direction (a Y direction) in the drawing. In this case, regarding terminal wirings 26 and 27, even when there is some deviation of a position in the vertical direction in the drawing, connection with the input/output wirings becomes easy, by slightly changing a length of a second layer metal in a vertical direction, for example. Therefore, to facilitate replacement of cell A-2 with cell D-3, regarding terminal wirings 26 and 27, it is sufficient that a positional relationship in a lateral direction (an X direction) in the drawing, that is, in a direction perpendicular to a direction to which terminal wirings 26, 27 are extended is the same. Similarly, when the terminal wirings are extended to a lateral direction in the drawings, it is preferable that a positional relationship in a vertical direction in the drawings is the same.

The exemplary embodiments described above can be achieved by combining the exemplary embodiments with each other. For example, by achieving the first exemplary embodiment and the third exemplary embodiment in combination, cell A that cannot be replaced with cell C because there is no adjacent space area although there is room in timing can be replaced with cell D. With this arrangement, an effect of suppressing leak current can be more increased.

In the first and second exemplary embodiments, description has been made by taking a two-input NAND cell as an example, and in the third exemplary embodiment, description has been made by taking an inverter as an example. These are just examples, and the above exemplary embodiments can be also similarly applied to standard cells of other logics.

As described above, in the above semiconductor integrated circuit device, leak current can be suppressed without increasing a chip area. Therefore, the semiconductor integrated circuit device is useful to produce small chips and to reduce cost, for example.

What is claimed is:

1. A semiconductor integrated circuit device arrayed with a plurality of standard cells, comprising:
    a first standard cell which has a first cell width and in which a MOS transistor constituting a circuit has a first gate length;
    a second standard cell which has the same logic as that of the first standard cell and has a second cell width larger than the first cell width, and in which a MOS transistor constituting a circuit has the first gate length; and
    a third standard cell which has the same logic as that of the first and second standard cells and has the second cell width, and in which a shape of a gate of a MOS transistor constituting a circuit is different from that of the second standard cell, wherein
    the third standard cell
    includes at least one MOS transistor having a second gate length larger than the first gate length.

2. The semiconductor integrated circuit device according to claim 1, wherein
    the third standard cell
    includes a MOS transistor having the first gate length, in addition to the MOS transistor having the second gate length.

3. The semiconductor integrated circuit device according to claim 1, wherein
    the second and third standard cells
    have the same positional relationship of vias that are connected to a plurality of terminal wirings which become an input terminal and an output terminal.

4. The semiconductor integrated circuit device according to claim 1, wherein
    in the second and third standard cells,
    a plurality of terminal wirings that become an input terminal and an output terminal are extended to a first direction, and a positional relationship of the plurality of terminal wirings in a second direction perpendicular to the first direction is the same.

5. The semiconductor integrated circuit device according to claim 1, wherein
    in the first and second standard cells,
    at least one of an interval between adjacent gates, a gate width, a shape of a gate, a shape of a diffusion region, and a positional relationship between a gate and a contact is the same.

6. A semiconductor integrated circuit device arrayed with a plurality of standard cells, comprising:
    a first standard cell which has a first cell width and in which a MOS transistor constituting a circuit has a first gate length;

a second standard cell which has the same logic as that of the first standard cell and has a second cell width larger than the first cell width, and in which a MOS transistor constituting a circuit has the first gate length; and a third standard cell which has the same logic as that of the first and second standard cells and has the second cell width, and in which a shape of a gate of a MOS transistor constituting a circuit is different from that of the second standard cell, wherein the third standard cell includes two or more MOS transistors which correspond to one MOS transistor in the second standard cell, have the first gate lengths, are connected in series, and have the gates connected in common.

7. The semiconductor integrated circuit device according to claim 6, wherein the second and third standard cells have the same positional relationship of vias that are connected to a plurality of terminal wirings which become an input terminal and an output terminal.

8. The semiconductor integrated circuit device according to claim 6, wherein in the second and third standard cells, a plurality of terminal wirings that become an input terminal and an output terminal are extended to a first direction, and a positional relationship of the plurality of terminal wirings in a second direction perpendicular to the first direction is the same.

9. The semiconductor integrated circuit device according to claim 6, wherein in the first and second standard cells, at least one of an interval between adjacent gates, a gate width, a shape of a gate, a shape of a diffusion region, and a positional relationship between a gate and a contact is the same.

10. A semiconductor integrated circuit device arrayed with a plurality of standard cells, comprising:

a first standard cell that has a first cell width and that includes a first parallel transistor group including two or more MOS transistors having first gate lengths, connected in parallel, and having gates connected in common, as MOS transistors constituting a circuit; and a second standard cell that has the same logic as that of the first standard cell and has the first cell width, and that includes a second parallel transistor group corresponding to the first parallel transistor group, as MOS transistors constituting a circuit, wherein the second parallel transistor group includes two or more MOS transistors connected in parallel, and having gates connected in common, and includes at least one MOS transistor having the parallel number smaller than that of the first parallel transistor group and having a second gate length larger than the first gate length.

11. The semiconductor integrated circuit device according to claim 10, wherein the second parallel transistor group includes a MOS transistor having the first gate length, in addition to the MOS transistor having the second gate length.

12. A semiconductor integrated circuit device arrayed with a plurality of standard cells, comprising:

a first standard cell that has a first cell width and that includes a first parallel transistor group including two or more MOS transistors having first gate lengths, connected in parallel, and having gates connected in common, as MOS transistors constituting a circuit; and a second standard cell that has the same logic as that of the first standard cell and has the first cell width, and that includes a second parallel transistor group corresponding to the first parallel transistor group, as MOS transistors constituting a circuit, wherein the second parallel transistor group has two or more series-connected MOS transistors connected in parallel and having gates connected in common, and has the parallel number smaller than that of the first parallel transistor group, with each MOS transistor having the first gate length.

13. The semiconductor integrated circuit device according to claim 10, wherein the first and second standard cells have the same positional relationship of vias that are connected to a plurality of terminal wirings which become an input terminal and an output terminal.

14. The semiconductor integrated circuit device according to claim 10, wherein in the first and second standard cells, a plurality of terminal wirings that become an input terminal and an output terminal are extended to a first direction, and a positional relationship of the plurality of terminal wirings in a second direction perpendicular to the first direction is the same.

15. The semiconductor integrated circuit device according to claim 12, wherein the first and second standard cells have the same positional relationship of vias that are connected to a plurality of terminal wirings which become an input terminal and an output terminal.

16. The semiconductor integrated circuit device according to claim 12, wherein in the first and second standard cells, a plurality of terminal wirings that become an input terminal and an output terminal are extended to a first direction, and a positional relationship of the plurality of terminal wirings in a second direction perpendicular to the first direction is the same.

* * * * *